US012795867B2

(12) United States Patent
Balachandran et al.

(10) Patent No.: US 12,795,867 B2
(45) Date of Patent: Nov. 10, 2026

(54) IMMERSION COOLING SERVER SYSTEM WITH AI ACCELERATOR APPARATUSES USING IN-MEMORY COMPUTE CHIPLET DEVICES FOR TRANSFORMER WORKLOADS

(71) Applicant: d-MATRIX CORPORATION, Santa Clara, CA (US)

(72) Inventors: Jayaprakash Balachandran, Santa Clara, CA (US); Akhil Arunkumar, Santa Clara, CA (US); Aayush Ankit, Santa Clara, CA (US); Nithesh Kurella, Santa Clara, CA (US); Sudeep Bhoja, Cupertino, CA (US)

(73) Assignee: d-MATRIX CORPORATION, Santa Clara, CA (US)

( * ) Notice: Subject to any disclaimer, the term of this patent is extended or adjusted under 35 U.S.C. 154(b) by 524 days.

(21) Appl. No.: 18/511,093

(22) Filed: Nov. 16, 2023

(65) Prior Publication Data

US 2024/0090181 A1 Mar. 14, 2024

Related U.S. Application Data

(63) Continuation-in-part of application No. 18/486,989, filed on Oct. 13, 2023, now Pat. No. 12,353,985, which is a continuation-in-part of application No. 17/538,923, filed on Nov. 30, 2021, now Pat. No. 11,847,072.

(51) Int. Cl.
*H05K 7/20* (2006.01)

(52) U.S. Cl.
CPC ......... *H05K 7/20836* (2013.01); *H05K 7/203* (2013.01); *H05K 7/20318* (2013.01); *H05K 7/20809* (2013.01)

(58) Field of Classification Search
CPC .... H05K 7/203; G06F 1/206; G06F 2200/201
See application file for complete search history.

(56) References Cited

U.S. PATENT DOCUMENTS

2019/0098796 A1* 3/2019 Wakino .............. H05K 7/20272
2022/0400585 A1* 12/2022 Gao ....................... H05K 7/203

* cited by examiner

*Primary Examiner* — Jianying C Atkisson
*Assistant Examiner* — Khaled Ahmed Ali Al Samiri
(74) *Attorney, Agent, or Firm* — Ogawa P.C.

(57) ABSTRACT

An immersion cooling server system with AI accelerator apparatuses using in-memory compute chiplet devices. This system includes one or more immersion tanks with heat transfer fluid and configured with at least a condenser device. A plurality of AI accelerator servers is immersed in the heat transfer fluid in a bottom portion of the tanks and is configured to process transformer workloads while cooled by the immersion cooling configuration. Each of the servers includes a plurality of multiprocessors each having at least a first server central processing unit (CPU) and a second server CPU, both of which are coupled to a plurality of switch devices. Each switch device is coupled to a plurality of AI accelerator apparatuses. The apparatus includes one or more chiplets, each of which includes a plurality of digital in-memory compute (DIMC) devices configured to perform high throughput matrix computations for transformer based models.

55 Claims, 25 Drawing Sheets

1301

IMC – Matrix Multiply

| 384 | IMCs | | | |
|---|---|---|---|---|
| Cycles | AC1 | AC2 | AC3 | AC4 |
| 1,024 | K1 | K1 | K2 | K2 |
| 1,024 | K3 | K3 | K4 | K4 |
| 1,024 | K5 | K5 | K6 | K6 |
| 1,024 | Q1 | Q1 | Q2 | Q2 |
| 1,024 | Q3 | Q3 | Q4 | Q4 |
| 1,024 | Q5 | Q5 | Q6 | Q6 |
| 1,024 | QKT1 | QKT2 | QKT3 | QKT4 |
| 1,024 | QKT5 | QKT6 | V1 | V1 |
| 1,024 | V2 | V2 | V3 | V3 |
| 1,024 | V4 | V4 | V5 | V5 |
| 1,024 | V6 | V6 | XV1 | XV2 |
| 1,024 | XV3 | XV4 | XV5 | XV6 |

SIMD – Element Wise

| | SIMDs | | | |
|---|---|---|---|---|
| Cycles | SIMD1 | SIMD2 | SIMD3 | SIMD4 |
| 3,072 | Smax1 | Smax2 | Smax3 | Smax4 |
| 3,072 | Smax5 | Smax6 | | |

FIG. 13A

1302

IMC – Matrix Multiply

| 384 | IMCs | | | |
|---|---|---|---|---|
| Cycles | AC1 | AC2 | AC3 | AC4 |
| 1,024 | E1 | E1 | E1 | E1 |
| 1,024 | E1 | E1 | E1 | E1 |
| 1,024 | E2 | E2 | E2 | E2 |
| 1,024 | E2 | E2 | E2 | E2 |
| 1,024 | E3 | E3 | E3 | E3 |
| 1,024 | E3 | E3 | E3 | E3 |
| 1,024 | E4 | E4 | E4 | E4 |
| 1,024 | E4 | E4 | E4 | E4 |
| 1,024 | E5 | E5 | E5 | E5 |
| 1,024 | E5 | E5 | E5 | E5 |
| 1,024 | E6 | E6 | E6 | E6 |
| 1,024 | E6 | E6 | E6 | E6 |

SIMD – Element Wise

| | SIMDs | | | |
|---|---|---|---|---|
| Cycles | SIMD1 | SIMD2 | SIMD3 | SIMD4 |
| | | | | |
| 410 | GeLU1 | GeLU1 | GeLU1 | GeLU1 |
| 410 | GeLU1 | GeLU1 | GeLU1 | GeLU1 |
| 410 | GeLU2 | GeLU2 | GeLU2 | GeLU2 |
| 410 | GeLU2 | GeLU2 | GeLU2 | GeLU2 |
| 410 | GeLU3 | GeLU3 | GeLU3 | GeLU3 |
| 410 | GeLU3 | GeLU3 | GeLU3 | GeLU3 |
| 410 | GeLU4 | GeLU4 | GeLU4 | GeLU4 |
| 410 | GeLU4 | GeLU4 | GeLU4 | GeLU4 |
| 410 | GeLU5 | GeLU5 | GeLU5 | GeLU5 |
| 410 | GeLU5 | GeLU5 | GeLU5 | GeLU5 |
| 410 | GeLU6 | GeLU6 | GeLU6 | GeLU6 |
| 410 | GeLU6 | GeLU6 | GeLU6 | GeLU6 |

FIG. 13B

1303

| IMC – Matrix Multiply | | | | |
|---|---|---|---|---|
| 384 | IMCs | | | |
| Cycles | AC1 | AC2 | AC3 | AC4 |
| 1,024 | F1 | F1 | F1 | F1 |
| 1,024 | F1 | F1 | F1 | F1 |
| 1,024 | F2 | F2 | F2 | F2 |
| 1,024 | F2 | F2 | F2 | F2 |
| 1,024 | F3 | F3 | F3 | F3 |
| 1,024 | F3 | F3 | F3 | F3 |
| 1,024 | F4 | F4 | F4 | F4 |
| 1,024 | F4 | F4 | F4 | F4 |
| 1,024 | F5 | F5 | F5 | F5 |
| 1,024 | F5 | F5 | F5 | F5 |
| 1,024 | F6 | F6 | F6 | F6 |
| 1,024 | F6 | F6 | F6 | F6 |

| SIMD – Element Wise | | | | |
|---|---|---|---|---|
| | SIMDs | | | |
| Cycles | SIMD1 | SIMD2 | SIMD3 | SIMD4 |
| | | | | |
| | F-b-1 | F-b-1 | F-b-1 | F-b-1 |
| 205 | LRN1 | LRN1 | LRN1 | LRN1 |
| | | | | |
| | F-b-2 | F-b-2 | F-b-2 | F-b-2 |
| 205 | LRN2 | LRN2 | LRN2 | LRN2 |
| | | | | |
| | F-b-3 | F-b-3 | F-b-3 | F-b-3 |
| 205 | LRN3 | LRN3 | LRN3 | LRN3 |
| | | | | |
| | F-b-4 | F-b-4 | F-b-4 | F-b-4 |
| 205 | LRN4 | LRN4 | LRN4 | LRN4 |
| | | | | |
| | F-b-5 | F-b-5 | F-b-5 | F-b-5 |
| 205 | LRN5 | LRN5 | LRN5 | LRN5 |
| | | | | |
| | F-b-6 | F-b-6 | F-b-6 | F-b-6 |
| 205 | LRN6 | LRN6 | LRN6 | LRN6 |

FIG. 13C

IMMERSION COOLING SERVER SYSTEM WITH AI ACCELERATOR APPARATUSES USING IN-MEMORY COMPUTE CHIPLET DEVICES FOR TRANSFORMER WORKLOADS

CROSS-REFERENCES TO RELATED APPLICATIONS

This application is a continuation-in-part of U.S. patent application Ser. No. 18/486,989, filed Oct. 13, 2023, which is a continuation-in-part of U.S. patent application Ser. No. 17/538,923, filed Nov. 30, 2021.

BACKGROUND OF THE INVENTION

The present invention relates generally to integrated circuit (IC) devices and artificial intelligence (AI). More specifically, the present invention relates to methods and device structures for accelerating computing workloads in transformer-based models (a.k.a. transformers).

The transformer has been the dominant neural network architecture in the natural language processing (NLP) field, and its use continues to expand into other machine learning applications. The original Transformer was introduced in the paper "Attention is all you need" (Vaswani et al., 2017), which sparked the development of many transformer model variations, such as the generative pre-trained transformer (GPT) and the bidirectional encoder representations from transformers (BERT) models. Such transformers have significantly outperformed other models in inference tasks by their use of a self-attention mechanism that avoids recursion and allows for easy parallelism. On the other hand, the transformer workloads are very computationally intensive and have high memory requirements, and have been plagued as being time-intensive and inefficient.

Most recently, NLP models have grown by a thousand times in both model size and compute requirements. For example, it can take about 4 months for 1024 graphics processing units (GPUs) to train a model like GPT-3 with 175 billion parameters. New NLP models having a trillion parameters are already being developed, and multi-trillion parameter models are on the horizon. Such rapid growth has made it increasingly difficult to serve NLP models at scale.

From the above, it can be seen that improved devices and method to accelerate compute workloads for transformers are highly desirable.

BRIEF SUMMARY OF THE INVENTION

The present invention relates generally to integrated circuit (IC) devices and artificial intelligence (AI) systems. More particularly, the present invention relates to methods and device structures for accelerating computing workloads in transformer-based neural network models (a.k.a. transformers). These methods and structures can be used in machine/deep learning applications such as natural language processing (NLP), computer vision (CV), and the like. Merely by way of example, the invention has been applied to AI accelerator apparatuses and chiplet devices configured to perform high throughput operations for NLP.

In an example, the present invention provides for an immersion cooling server system configured for processing transformer workloads using AI accelerator apparatuses with in-memory compute chiplet devices. This system includes one or more immersion tanks each having at least a heat transfer fluid in liquid form configured within a bottom tank portion and a condenser device coupled to a top tank portion. A plurality of AI accelerator server systems is immersed in the heat transfer fluid and is configured to process transformer workloads. During operation, these server systems generate heat that is absorbed by the heat transfer fluid, which will evaporate into heat transfer fluid vapor at its boiling point. When the vapor rises, the condenser device condenses the vapor back to liquid form, which returns to the fluid at the bottom tank portion. A cooling device can be configured with the condenser to return the vapor to fluid form, and a pressure regulator device can be configured with the condenser to relieve system pressure when needed. Further, a controller device can be configured to monitor system conditions using one or more sensors and to adjust the operation of the condenser device, pressure regulator device, cooling device, and any other immersion cooling components.

Each of the server systems includes a plurality of multiprocessors, and each multiprocessor includes at least a first central processing unit (CPU) and a second CPU. The first CPU is coupled the second CPU via a point-to-point interconnect, and the first CPU and the second CPU are each coupled to a plurality of memory devices. Further, the first CPU is also coupled a network interface controller (NIC) device. The server system also includes a plurality of connected switch devices coupled to the plurality of multiprocessors such that each of the CPUs of each multiprocessor is coupled to a different switch device. And, each of the switch devices is coupled to a plurality of AI accelerator apparatuses. The server system can be configured as a multi-node system with a plurality of server nodes, each of which can include the server system configuration discussed previously.

The apparatus includes one or more chiplets, each of which includes a plurality of tiles. Each tile includes a plurality of slices, a CPU, and a hardware dispatch device. Each slice can include a digital in-memory compute (DIMC) device configured to perform high throughput computations. In particular, the DIMC device can be configured to accelerate the computations of attention functions for transformers applied to machine learning applications. A single input multiple data (SIMD) device configured to further process the DIMC output and compute softmax functions for the attention functions. The chiplet can also include die-to-die (D2D) interconnects, a peripheral component interconnect express (PCIe) bus, a dynamic random access memory (DRAM) interface, and a global CPU interface to facilitate communication between the chiplets, memory and a server or host system.

The AI accelerator and chiplet device architecture and its related methods can provide many benefits. With modular chiplets, the AI accelerator apparatus can be easily scaled to accelerate the workloads for transformers of different sizes. The DIMC configuration within the chiplet slices also improves computational performance and reduces power consumption by integrating computational functions and memory fabric. Further, embodiments of the AI accelerator apparatus can allow for quick and efficient mapping from the transformer to enable effective implementation of AI applications.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 13A-13C are simplified tables illustrating data flow through the IMC and single input multiple data (SIMD) modules according to an example of the present invention.

DETAILED DESCRIPTION OF THE INVENTION

The present invention relates generally to integrated circuit (IC) devices and artificial intelligence (AI) systems. More particularly, the present invention relates to methods and device structures for accelerating computing workloads in transformer-based neural network models (a.k.a. transformers). These methods and structures can be used in machine/deep learning applications such as natural language processing (NLP), computer vision (CV), and the like. Merely by way of example, the invention has been applied to AI accelerator apparatuses and chiplet devices configured to perform high throughput operations for NLP.

Currently, the vast majority of NLP models are based on the transformer model, such as the bidirectional encoder representations from transformers (BERT) model, BERT Large model, and generative pre-trained transformer (GPT) models such as GPT-2 and GPT-3, etc. However, these transformers have very high compute and memory requirements. According to an example, the present invention provides for an apparatus using chiplet devices that are configured to accelerate transformer computations for AI applications. Examples of the AI accelerator apparatus are shown in FIGS. 1A and 1B.

Figure 1A:
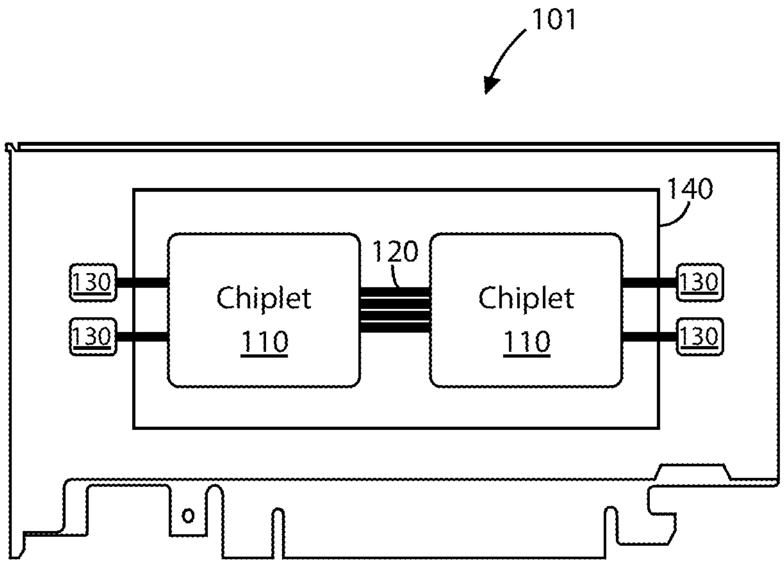
FIGS. 1A-1B are simplified block diagrams illustrating AI accelerator apparatuses according to examples of the present invention.

FIG. 1A illustrates a simplified AI accelerator apparatus 101 with two chiplet devices 110. As shown, the chiplet devices 110 are coupled to each other by one or more die-to-die (D2D) interconnects 120. Also, each chiplet device 110 is coupled to a memory interface 130 (e.g., static random access memory (SRAM), dynamic random access memory (DRAM), synchronous dynamic RAM (SDRAM), or the like). The apparatus 101 also includes a substrate member 140 that provides mechanical support to the chiplet devices 110 that are configured upon a surface region of the substrate member 140. The substrate can include interposers, such as a silicon interposer, glass interposer, organic interposer, or the like. The chiplets can be coupled to one or more interposers, which can be configured to enable communication between the chiplets and other components (e.g., serving as a bridge or conduit that allows electrical signals to pass between internal and external elements).

Figure 1B:
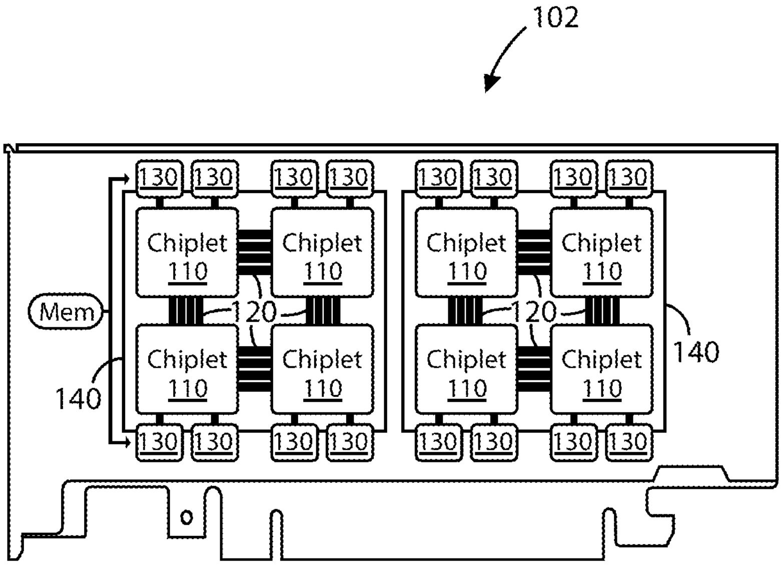

FIG. 1B illustrates a simplified AI accelerator apparatus 102 with eight chiplet devices 110 configured in two groups of four chiplets on the substrate member 140. Here, each chiplet device 110 within a group is coupled to other chiplet devices by one or more D2D interconnects 120. Apparatus 102 also shows a DRAM memory interface 130 coupled to each of the chiplet devices 110. The DRAM memory interface 130 can be coupled to one or more memory modules, represented by the "Mem" block.

As shown, the AI accelerator apparatuses 101 and 102 are embodied in peripheral component interconnect express (PCIe) card form factors, but the AI accelerator apparatus can be configured in other form factors as well. These PCIe card form factors can be configured in a variety of dimensions (e.g., full height, full length (FHFL); half height, half length (HHHL), etc.) and mechanical sizes (e.g., 1×, 2×, 4×, 16×, etc.). In an example, one or more substrate members 140, each having one or more chiplets, are coupled to a PCIe card. Those of ordinary skill in the art will recognize other variations, modifications, and alternatives to these elements and configurations of the AI accelerator apparatus.

Embodiments of the AI accelerator apparatus can implement several techniques to improve performance (e.g., computational efficiency) in various AI applications. The AI accelerator apparatus can include digital in-memory-compute (DIMC) to integrate computational functions and memory fabric. Algorithms for the mapper, numerics, and sparsity can be optimized within the compute fabric. And, use of chiplets and interconnects configured on organic interposers can provide modularity and scalability.

According to an example, the present invention implements chiplets with in-memory-compute (IMC) functionality, which can be used to accelerate the computations required by the workloads of transformers. The computations for training these models can include performing a scaled dot-product attention function to determine a probability distribution associated with a desired result in a particular AI application. In the case of training NLP models, the desired result can include predicting subsequent words, determining contextual word meaning, translating to another language, etc.

The chiplet architecture can include a plurality of slice devices (or slices) controlled by a central processing unit (CPU) to perform the transformer computations in parallel. Each slice is a modular IC device that can process a portion of these computations. The plurality of slices can be divided into tiles/gangs (i.e., subsets) of one or more slices with a CPU coupled to each of the slices within the tile. This tile CPU can be configured to perform transformer computations in parallel via each of the slices within the tile. A global CPU can be coupled to each of these tile CPUs and be configured to perform transformer computations in parallel via all of the slices in one or more chiplets using the tile CPUs. Further details of the chiplets are discussed in reference to FIGS. 2A-5B, while transformers are discussed in reference to FIGS. 6-9.

Figure 2A:
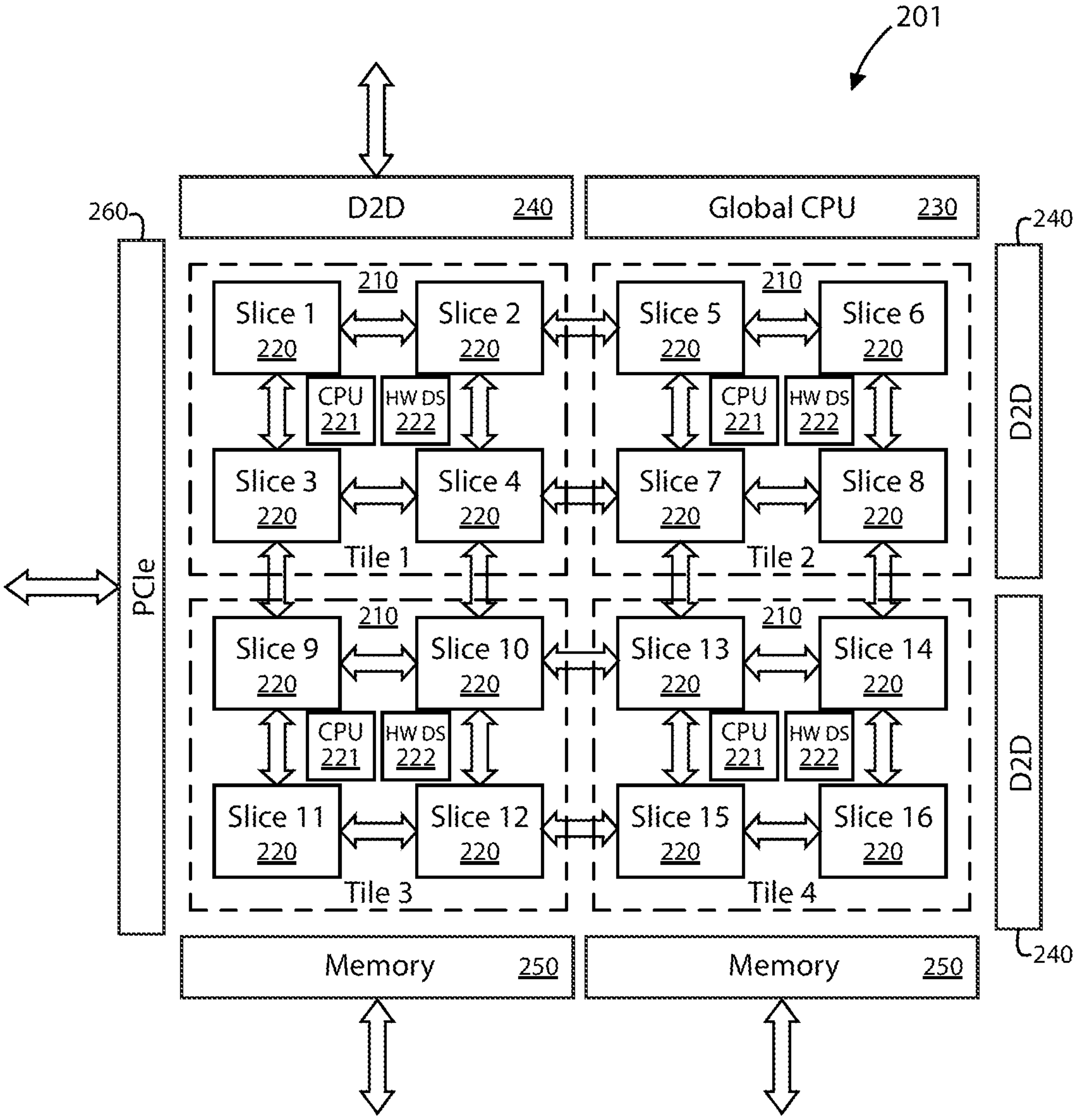
FIGS. 2A-2B are simplified block diagrams illustrating 16-slice chiplet devices according to examples of the present invention.

FIG. 2A is a simplified block diagram illustrating an example configuration of a 16-slice chiplet device 201. In this case, the chiplet 201 includes four tile devices 210, each of which includes four slice devices 220, a CPU 221, and a hardware dispatch (HW DS) device 222. In a specific example, these tiles 210 are arranged in a symmetrical manner. As discussed previously, the CPU 221 of a tile 210 can coordinate the operations performed by all slices within the tile. The HW DS 222 is coupled to the CPU 221 and can be configured to coordinate control of the slices 220 in the tile 210 (e.g., to determine which slice in the tile processes a target portion of transformer computations). In a specific example, the CPU 221 can be a reduced instruction set computer (RISC) CPU, or the like. Further, the CPU 221 can be coupled to a dispatch engine, which is configured to coordinate control of the CPU 221 (e.g., to determine which portions of transformer computations are processed by the particular CPU).

The CPUs 221 of each tile 210 can be coupled to a global CPU via a global CPU interface 230 (e.g., buses, connectors, sockets, etc.). This global CPU can be configured to coordinate the processing of all chiplet devices in an AI accelerator apparatus, such as apparatuses 101 and 102 of FIGS. 1A and 1B, respectively. In an example, a global CPU can use the HW DS 222 of each tile to direct each associated CPU 221 to perform various portions of the transformer computations across the slices in the tile. Also, the global CPU can be a RISC processor, or the like. The chiplet 201 also includes D2D interconnects 240 and a memory interface 250, both of which are coupled to each of the CPUs 221 in each of the tiles. In an example, the D2D interconnects can be configured with single-ended signaling. The memory interface 250 can include one or more memory buses coupled to one or more memory devices (e.g., DRAM, SRAM, SDRAM, or the like).

Further, the chiplet 201 includes a PCIe interface/bus 260 coupled to each of the CPUs 221 in each of the tiles. The PCIe interface 260 can be configured to communicate with a server or other communication system. In the case of a plurality of chiplet devices, a main bus device is coupled to the PCIe bus 260 of each chiplet device using a master chiplet device (e.g., main bus device also coupled to the master chiplet device). This master chiplet device is coupled to each other chiplet device using at least the D2D interconnects 240. The master chiplet device and the main bus device can be configured overlying a substrate member (e.g., same substrate as chiplets or separate substrate). An apparatus integrating one or more chiplets can also be coupled to a power source (e.g., configured on-chip, configured in a system, or coupled externally) and can be configured and operable to a server, network switch, or host system using the main bus device. The server apparatus can also be one of a plurality of server apparatuses configured for a server farm within a data center, or other similar configuration.

In a specific example, an AI accelerator apparatus configured for GPT-3 can incorporate eight chiplets (similar to apparatus 102 of FIG. 1B). The chiplets can be configured with D2D 16×16 Gb/s interconnects, 32-bit LPDDRS 6.4 Gb/s memory modules, and 16 lane PCIe Gen 5 PHY NRZ 32 Gb/s/lane interface. LPDDRS (16×16 GB) can provide the necessary capacity, bandwidth and low power for large scale NLP models, such as quantized GPT-3. Of course, there can be other variations, modifications, and alternatives.

Figure 2B:
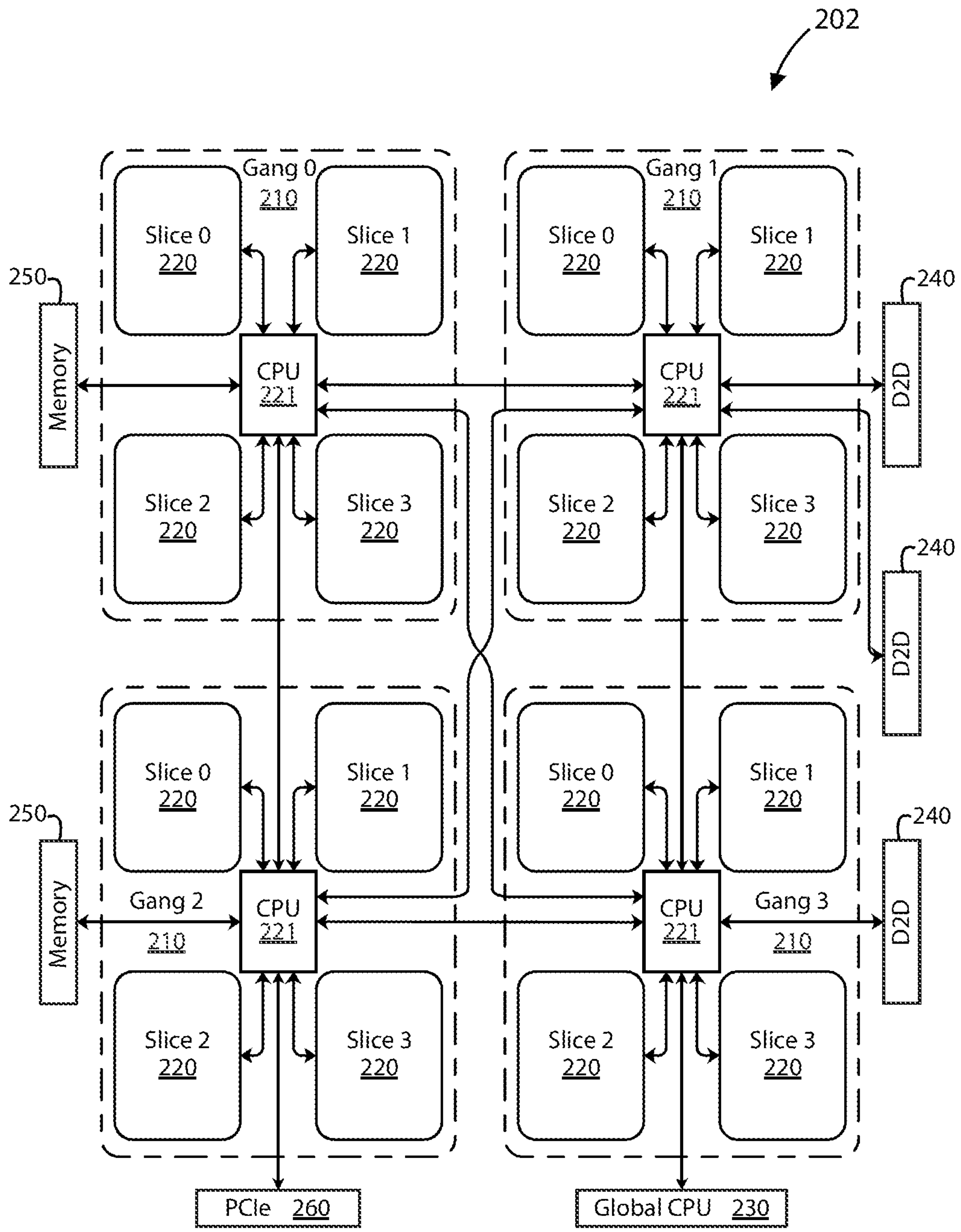

FIG. 2B is a simplified block diagram illustrating an example configuration of a 16-slice chiplet device 202. Similar to chiplet 201, chiplet 202 includes four gangs 210 (or tiles), each of which includes four slice devices 220 and a CPU 221. As shown, the CPU 221 of each gang/tile 210 is coupled to each of the slices 220 and to each other CPU 221 of the other gangs/tiles 210. In an example, the tiles/gangs serve as neural cores, and the slices serve as compute cores. With this multi-core configuration, the chiplet device can be configured to take and run several computations in parallel. The CPUs 221 are also coupled to a global CPU interface 230, D2D interconnects 240, a memory interface 250, and a PCIe interface 260. As described for FIG. 2A, the global CPU interface 230 connects to a global CPU that controls all of the CPUs 221 of each gang 210.

Figure 3A:
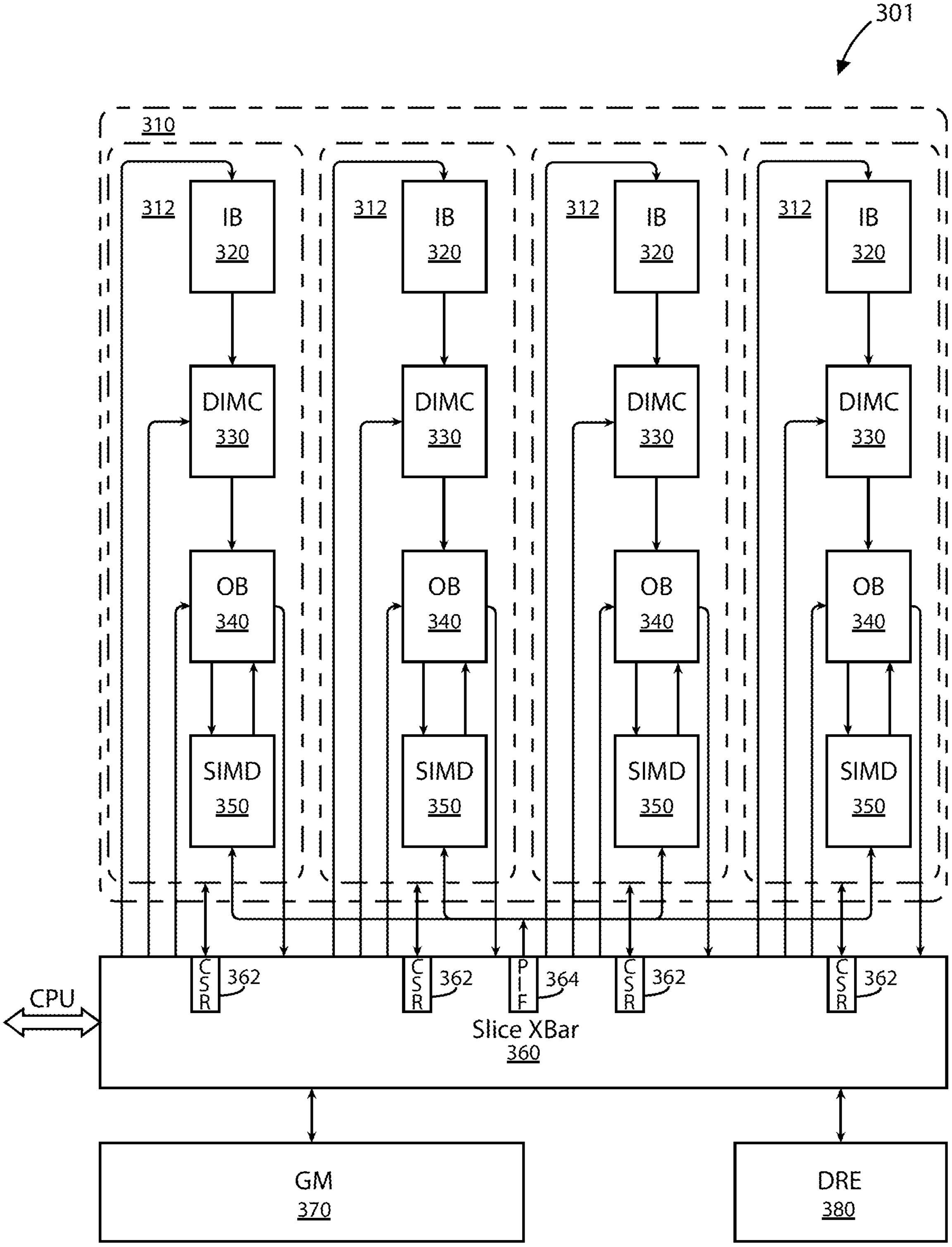
FIGS. 3A-3B are simplified block diagrams illustrating slice devices according to examples of the present invention.

FIG. 3A is a simplified block diagram illustrating an example slice device 301 of a chiplet. For the 16-slice chiplet example, slice device 301 includes a compute core 310 having four compute paths 312, each of which includes an input buffer (IB) device 320, a digital in-memory-compute (DIMC) device 330, an output buffer (OB) device 340, and a Single Instruction, Multiple Data (SIMD) device 350 coupled together. Each of these paths 312 is coupled to a slice cross-bar/controller 360, which is controlled by the tile CPU to coordinate the computations performed by each path 312.

In an example, the DIMC is coupled to a clock and is configured within one or more portions of each of the plurality of slices of the chiplet to allow for high throughput of one or more matrix computations provided in the DIMC such that the high throughput is characterized by 512 multiply accumulates per a clock cycle. In a specific example, the clock coupled to the DIMC is a second clock derived from a first clock (e.g., chiplet clock generator, AI accelerator apparatus clock generator, etc.) configured to output a clock signal of about 0.5 GHz to 4 GHz; the second clock can be configured at an output rate of about one half of the rate of the first clock. The DIMC can also be configured to support a block structured sparsity (e.g., imposing structural constraints on weight patterns of a neural networks like a transformer).

In an example, the SIMD device 350 is a SIMD processor coupled to an output of the DIMC. The SIMD 350 can be configured to process one or more non-linear operations and one or more linear operations on a vector process. The SIMD 350 can be a programmable vector unit or the like. The SIMD 350 can also include one or more random-access memory (RAM) modules, such as a data RAM module, an instruction RAM module, and the like.

In an example, the slice controller 360 is coupled to all blocks of each compute path 312 and also includes a control/status register (CSR) 362 coupled to each compute path. The slice controller 360 is also coupled to a memory bank 370 and a data reshape engine (DRE) 380. The slice controller 360 can be configured to feed data from the memory bank 370 to the blocks in each of the compute paths 312 and to coordinate these compute paths 312 by a processor interface (PIF) 364. In a specific example, the PIF 364 is coupled to the SIMD 350 of each compute path 312.

Figure 3B:
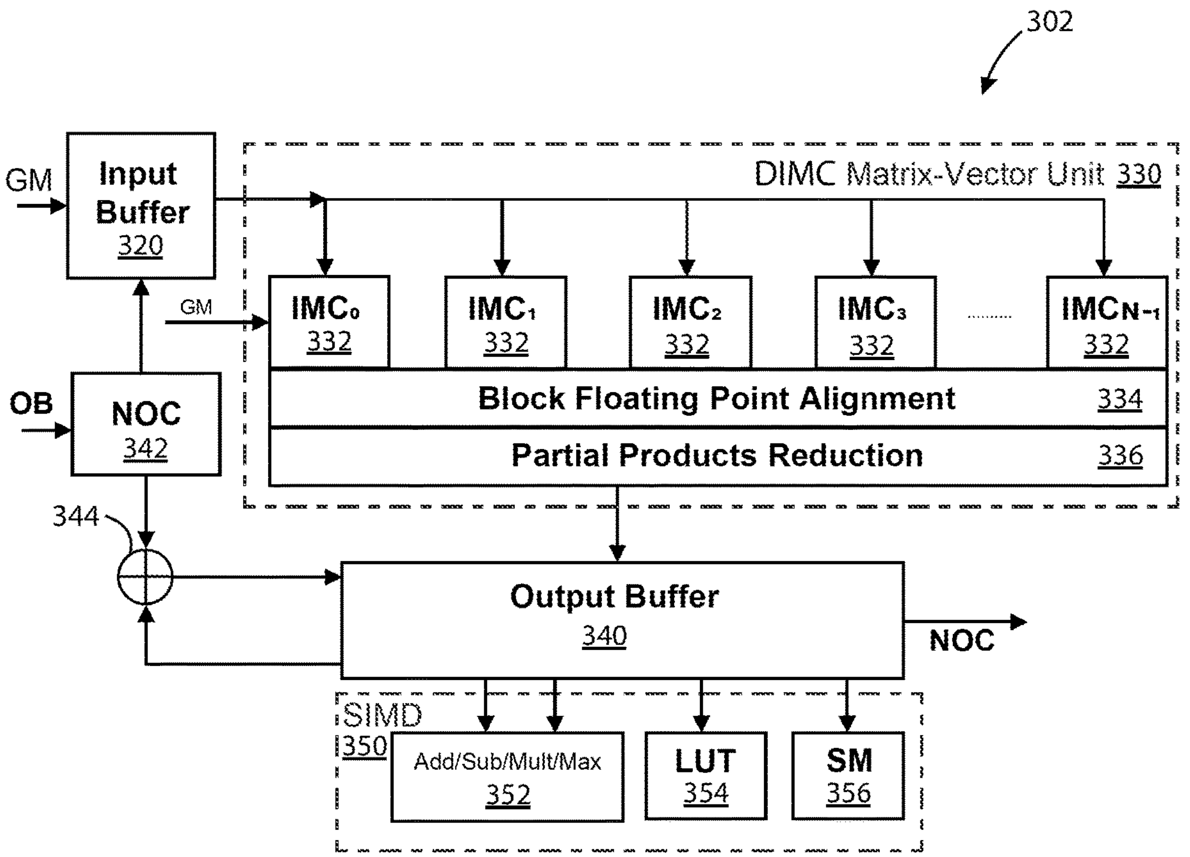

Further details for the compute core 310 are shown in FIG. 3B. The simplified block diagram of slice device 302 includes an input buffer 320, a DIMC matrix vector unit 330, an output buffer 340, a network on chip (NoC) device 342, and a SIMD vector unit 350. The DIMC unit 330 includes a plurality of in-memory-compute (IMC) modules 332 configured to compute a Scaled Dot-Product Attention function on input data to determine a probability distribution, which requires high-throughput matrix multiply-accumulate operations.

These IMC modules 332 can also be coupled to a block floating point alignment module 334 and a partial products reduction module 336 for further processing before outputting the DIMC results to the output buffer 540. In an example, the input buffer 320 receives input data (e.g., data vectors) from the memory bank 370 (shown in FIG. 3A) and sends the data to the IMC modules 332. The IMC modules 332 can also receive instructions from the memory bank 370 as well.

In addition to the details discussed previously, the SIMD 350 can be configured as an element-wise vector unit. The SIMD 350 can includes a computation unit 352 (e.g., add, subtract, multiply, max, etc.), a look-up table (LUT) 354, and a state machine (SM) module 356 configured to receive one or more outputs from the output buffer 340.

The NoC device 342 is coupled to the output buffer 340 configured in a feedforward loop via shortcut connection 344. Also, the NoC device 342 is coupled to each of the slices and is configured for multicast and unicast processes. More particularly, the NoC device 342 can be configured to connect all of the slices and all of the tiles, multi-cast input activations to all of the slices/tiles, and collect the partial computations to be unicast for a specially distributed accumulation.

Considering the previous eight-chiplet AI accelerator apparatus example, the input buffer can have a capacity of 64 KB with 16 banks and the output buffer can have a capacity of 128 KB with 16 banks. The DIMC can be an 8-bit block have dimensions 64×64 (eight 64×64 IMC modules) and the NoC can have a size of 512 bits. The computation block in the SIMD can be configured for 8-bit and 32-bit integer (int) and unsigned integer (uint) computations. These slice components can vary depending on which transformer the AI accelerator apparatus will serve.

Figure 4:
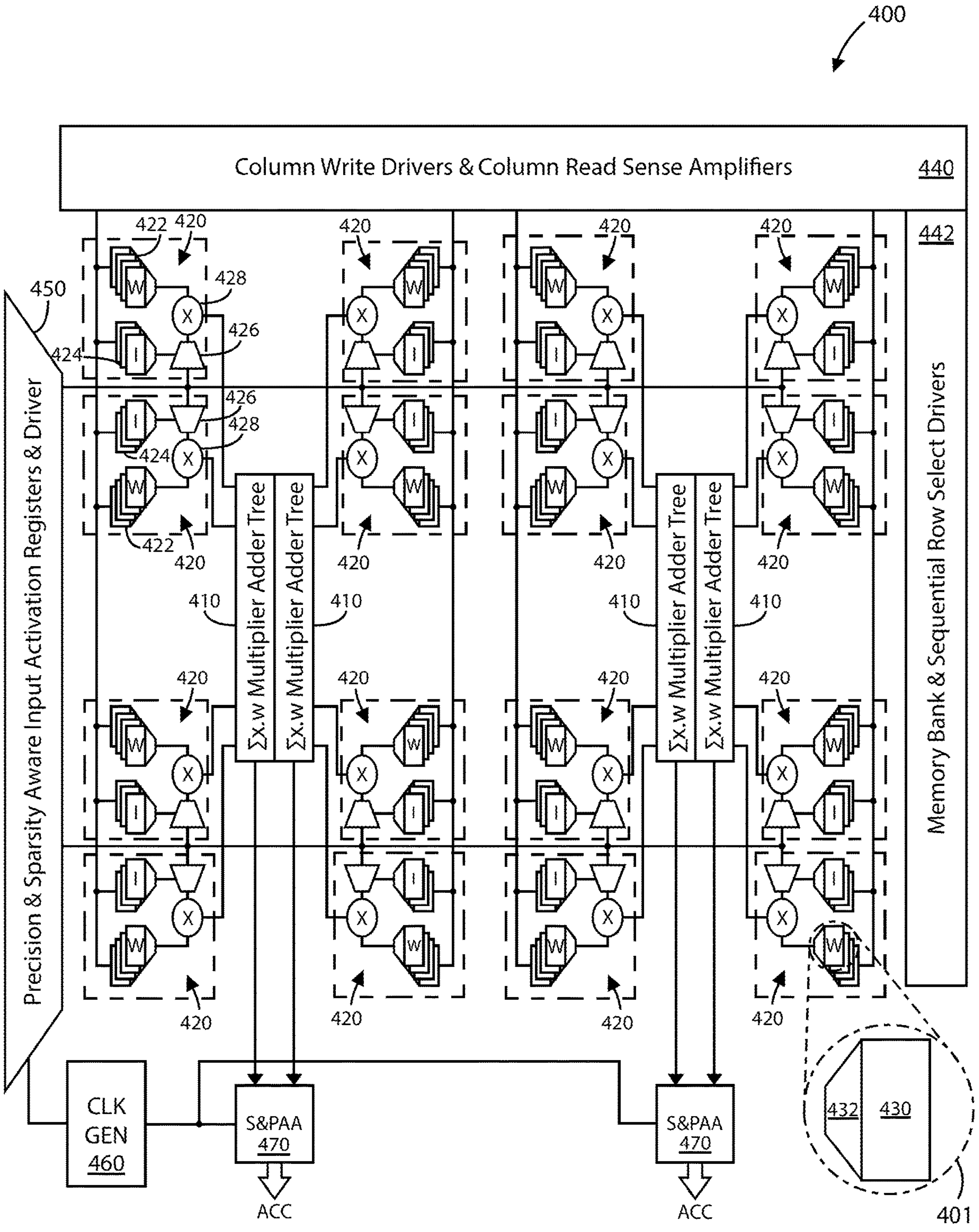
FIG. 4 is a simplified block diagram illustrating an in-memory-compute (IMC) module according to an example of the present invention.

FIG. 4 is a simplified block diagram illustrating an example IMC module 700. As shown, module 700 includes one or more computation tree blocks 410 that are configured to perform desired computations on input data from one or more read-write blocks 420. Each of these read-write blocks 420 includes one or more first memory-select units 422 (also denoted as "W"), one or more second memory-select units 424 (also denoted as "I"), an activation multiplexer 426, and an operator unit 428. The first memory-select unit 422 provides an input to the operator unit 428, while the second memory-select unit 424 controls the activation multiplexer 426 that is also coupled to the operator unit 428. In the case of multiply-accumulate operations, the operator unit 428 is a multiplier unit and the computation tree blocks 410 are multiplier adder tree blocks (i.e., Σx.w).

As shown in close-up 401, each of the memory-select units 422, 424 includes a memory cell 430 (e.g., SRAM cell, or the like) and a select multiplexer 432. Each of the memory-select units 422, 424 is coupled to a read-write controller 440, which is also coupled to a memory bank/driver block 442. In an example, the read-write controller 440 can be configured with column write drivers and column read sense amplifiers, while the memory bank/driver block 432 can configured with sequential row select drivers.

An input activation controller 450 can be coupled to the activation multiplexer 426 each of the read-write blocks 420. The input activation controller 450 can include precision and sparsity aware input activation register and drivers. The operator unit 428 receives the output of the first memory-select unit 422 and receives the output of this block 450 through the activation multiplexer 426, which is controlled by the output of the second memory-select unit 424. The output of the operator unit 428 is then fed into the computation tree block 410.

The input activation block 450 is also coupled to a clock source/generator 460. As discussed previously, the clock generator 460 can produce a second clock derived from a first clock configured to output a clock signal of about 0.5 GHz to 4 GHz; the second clock can be configured at an output rate of about one half of the rate of the first clock. The clock generator 460 is coupled to one or more sign and precision aware accumulators 470, which are configured to receive the output of the computation tree blocks 410. In an example, an accumulator 470 is configured to receive the outputs of two computation tree blocks 410. Example output readings of the IMC are shown in FIGS. 13A-13C.

Referring back to the eight-chiplet AI accelerator apparatus example, the memory cell can be a dual bank 2×6T SRAM cell, and the select multiplexer can be an 8T bank select multiplexer. In this case, the memory bank/driver block 442 includes a dual-bank SRAM bank. Also, the read/write controller can include 64 bytes of write drivers and 64 bytes of read sense amplifiers. Those of ordinary skill in the art will recognize other variations, modifications, and alternatives to these IMC module components and their configurations.

Figure 5A:
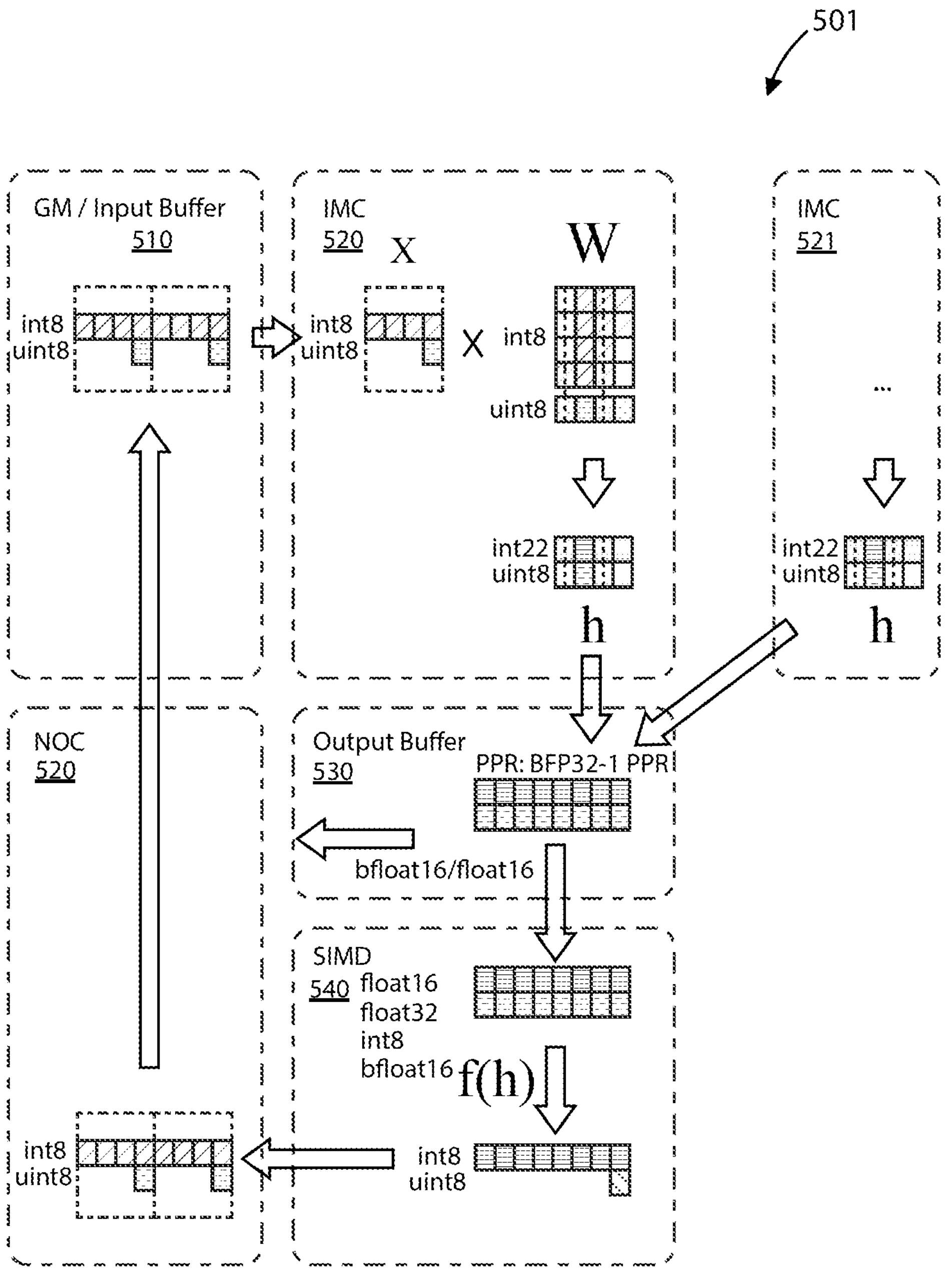
FIG. 5A is a simplified block flow diagram illustrating numerical formats of the data being processed in a slice device according to an example of the present invention.

FIG. 5A is a simplified block flow diagram illustrating example numerical formats of the data being processed in a slice. Diagram 501 shows a loop with the data formats for the GM/input buffer 510, the IMC 520, the output buffer 530, the SIMD 540, and the NoC 550, which feeds back to the GM/input buffer 510. The IMC block 520 shows the multiply-accumulate operation (Σx.w). Additionally, the format for the data from IMC 532 flows to the output buffer 530 as well. In this example, the numerical formats include integer (int), floating point (float), and block floating (bfloat) of varying lengths.

Figure 5B:
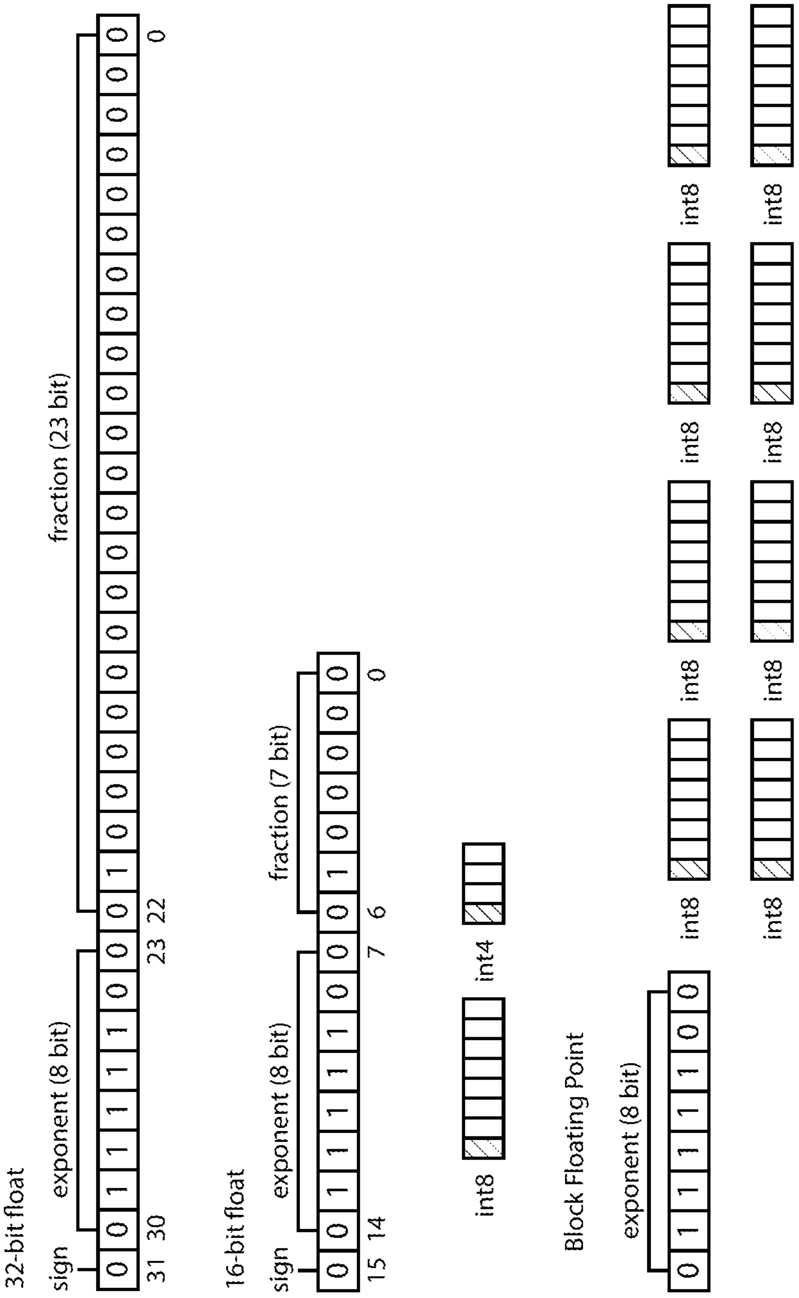
FIG. 5B is a simplified diagram illustrating example numerical formats.

FIG. 5B is a simplified diagram illustrating certain numerical formats, including certain formats shown in FIG. 5A. Block floating point numerics can be used to address certain barriers to performance. Training of transformers is generally done in floating point, i.e., 32-bit float or 16-bit float, and inference is generally done in 8-bit integer ("int8"). With block floating point, an exponent is shared across a set of mantissa significant values (see diagonally line filled blocks of the int8 vectors at the bottom of FIG. 5B), as opposed to floating point where each mantissa has a separate exponent (see 32-bit float and 16-bit float formats at the top of FIG. 5A). The method of using block floating point numerical formats for training can exhibit the efficiency of fixed point without the problems of integer arithmetic, and can also allow for use of a smaller mantissa, e.g., 4-bit integer ("int4") while retaining accuracy. Further, by using the block floating point format (e.g., for activation, weights, etc.) and sparsity, the inference of the training models can be accelerated for better performance. Those of ordinary skill in the art will recognize other variations, modifications, and alternatives to these numerical formats used to process transformer workloads.

Figure 6:
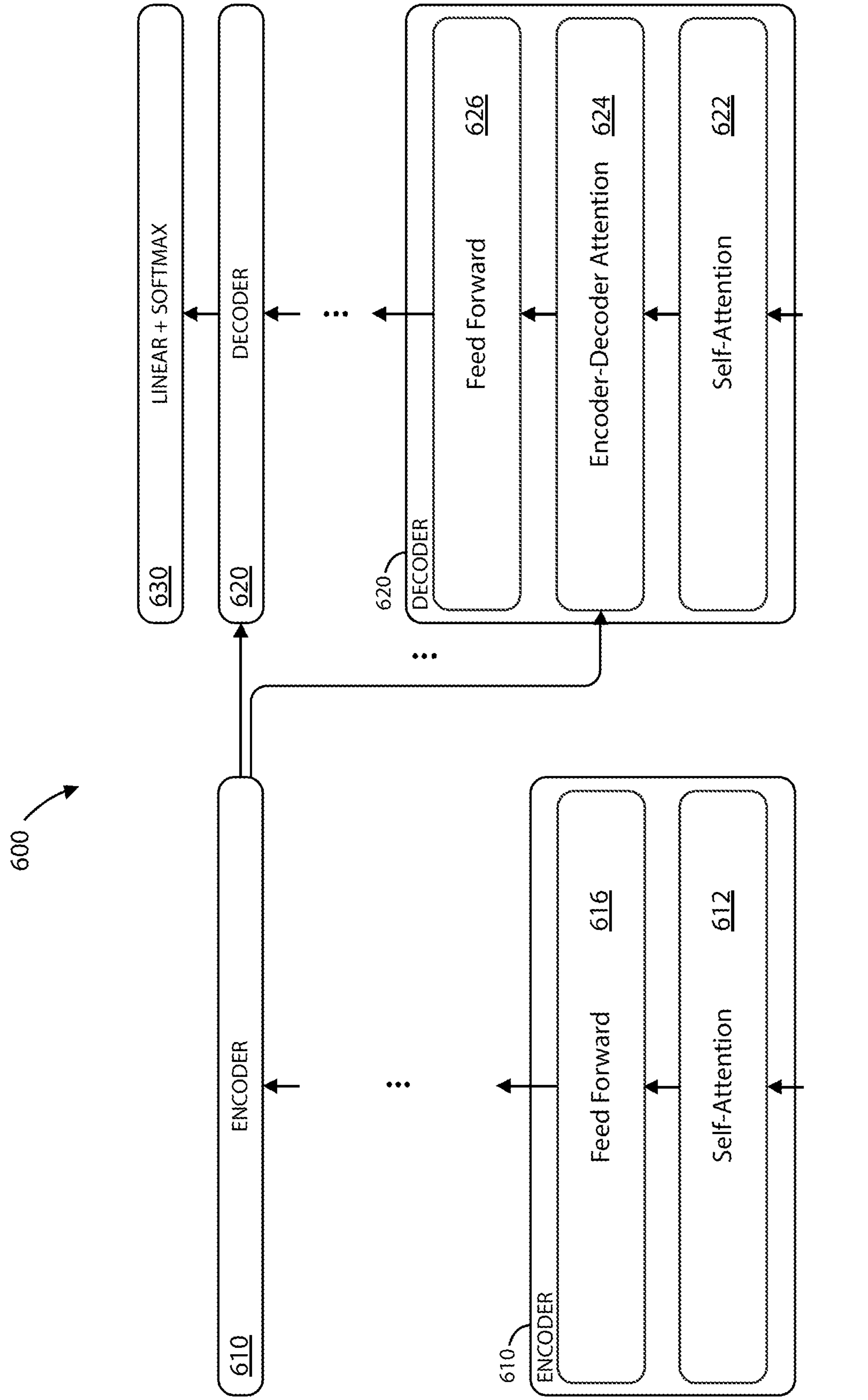
FIG. 6 is a simplified block diagram of a transformer architecture.

FIG. 6 illustrates a simplified transformer architecture 600. The typical transformer can be described as having an encoder stack configured with a decoder stack, and each such stack can have one or more layers. Within the encoder layers 610, a self-attention layer 612 determines contextual information while encoding input data and feeds the encoded data to a feed-forward neural network 616. The encoder layers 610 process an input sequence from bottom to top, transforming the output into a set of attention vectors K and V. The decoder layers 620 also include a corresponding self-attention layer 622 and feed-forward neural network 626, and can further include an encoder-decoder attention layer 624 uses the attention vectors from the encoder stack that aid the decoder in further contextual processing. The decoder stack outputs a vector of floating points (as discussed for FIG. 5B), which is fed to linear and softmax layers 630 to project the output into a final desired result (e.g., desired word prediction, interpretation, or translation). The linear layer is a fully-connected neural network that projects the decoder output vector into a larger vector (i.e., logits vector) that contains scores associated with all potential results (e.g., all potential words), and the softmax layer turns these scores into probabilities. Based on the this probability output, the projected word meaning may be chosen based on the highest probability or by other derived criteria depending on the application.

Transformer model variations include those based on just the decoder stack (e.g., transformer language models such as GPT-2, GPT-3, etc.) and those based on just the encoder stack (e.g., masked language models such as BERT, BERT Large, etc.). Transformers are based on four parameters: sequence length (S) (i.e., number of tokens), number of attention heads (A), number of layers (L), and embedding length (H). Variations of these parameters are used to build practically all transformer-based models today. Embodiments of the present invention can be configured for any similar model types.

A transformer starts as untrained and is pre-trained by exposure to a desired data set for a desired learning application. Transformer-based language models are exposed to large volumes of text (e.g., Wikipedia) to train language processing functions such as predicting the next word in a text sequence, translating the text to another language, etc. This training process involves converting the text (e.g., words or parts of words) into token IDs, evaluating the context of the tokens by a self-attention layer, and predicting the result by a feed forward neural network.

Figure 7:
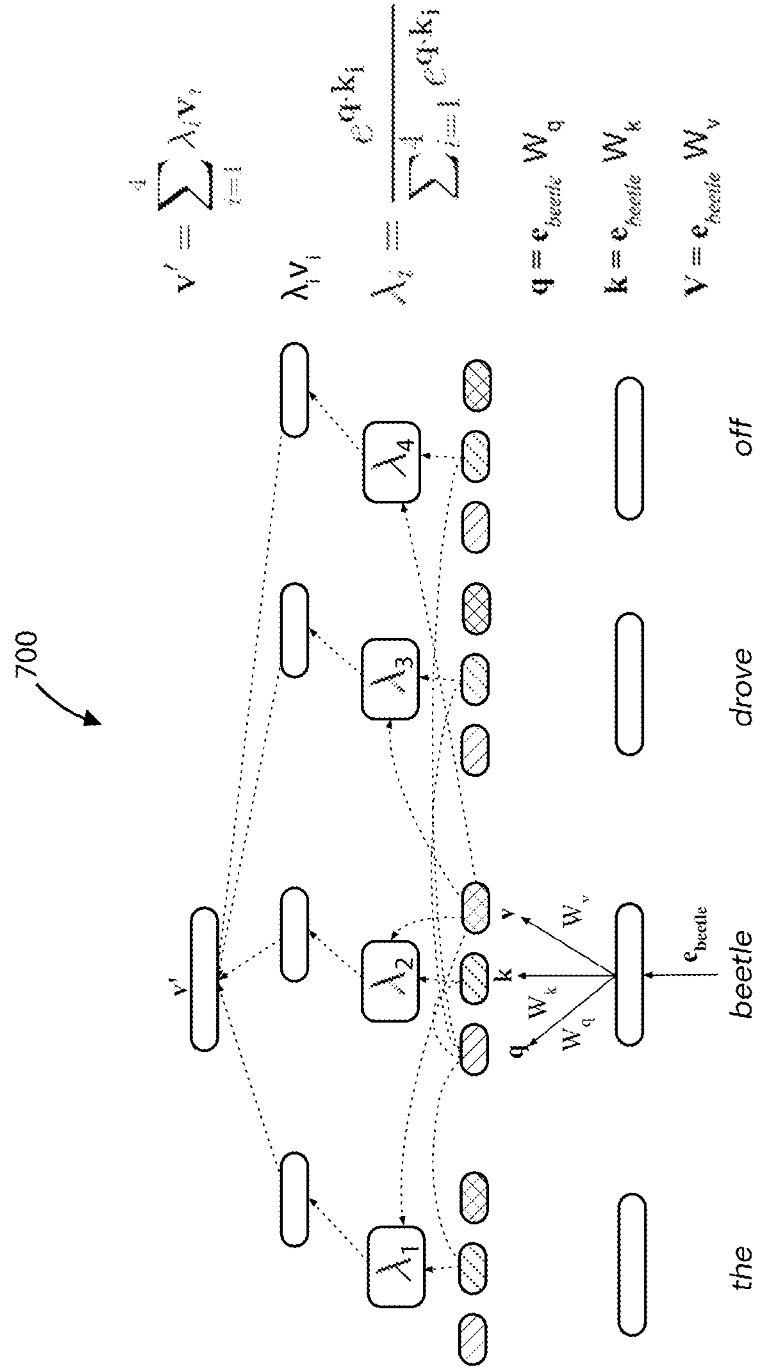
FIG. 7 is a simplified diagram illustrating a self-attention layer process for an example NLP model.

The self-attention process includes (1) determining query (Q), key (K), and value (V) vectors for the embedding of each word in an input sentence, (2) calculating a score for from the dot product of Q and K for each word of the input sentence against a target word, (3) dividing the scores by the square root of the dimension of K, (4) passing the result through a softmax operation to normalize the scores, (5) multiplying each V by the softmax score, and (6) summing up the weighted V vectors to produce the output. An example self-attention process 700 is shown in FIG. 7.

As shown, process 700 shows the evaluation of the sentence "the beetle drove off" at the bottom to determine the meaning of the word "beetle" (e.g., insect or automobile). The first step is to determine the $q_{beetle}$, $k_{beetle}$, and $v_{beetle}$ vectors for the embedding vector $e_{beetle}$. This is done by multiplying $e_{beetle}$ by three different pre-trained weight matrices $W_q$, $W_k$, and $W_v$. The second step is to calculate the dot products of (pectic with the K vector of each word in the sentence (i.e., $k_{the}$, $k_{beetle}$, $k_{drove}$, and $k_{off}$), shown by the arrows between $q_{beetle}$ and each K vector. The third step is to divide the scores by the square root of the dimension $d_k$, and the fourth step is to normalize the scores using a softmax function, resulting in $\lambda_i$. The fifth step is to multiply the V vectors by the softmax score ($\lambda_i v_i$) in preparation for the final step of summing up all the weight value vectors, shown by v' at the top.

Process 700 only shows the self-attention process for the word "beetle", but the self-attention process can be performed for each word in the sentence in parallel. The same steps apply for word prediction, interpretation, translation, and other inference tasks. Further details of the self-attention process in the BERT Large model are shown in FIGS. 8 and 9.

Figure 8:
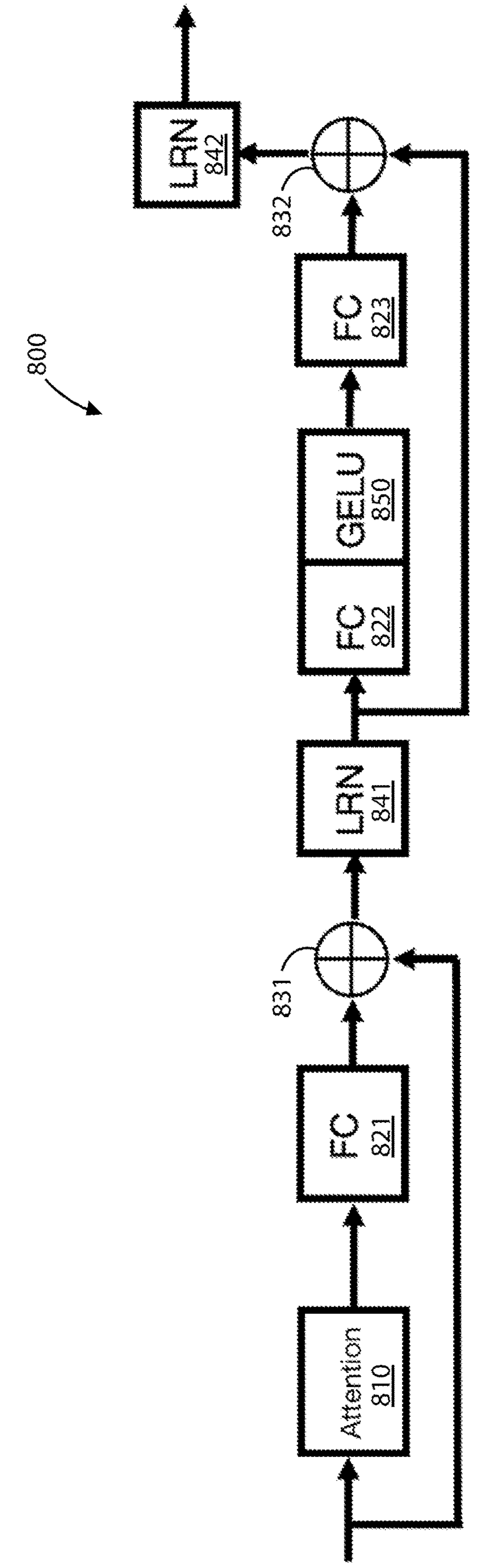
FIG. 8 is a simplified block diagram illustrating an example transformer.

A simplified block diagram of the BERT Large model (S=384, A=16, L=34, and H=1024) is shown in FIG. 8. This figure illustrates a single layer 800 of a BERT Large transformer, which includes an attention head device 810 configured with three different fully-connected (FC) matrices 821-823. As discussed previously, the attention head 810 receives embedding inputs (384×1024 for BERT Large) and measures the probability distribution to come up with a numerical value based on the context of the surrounding words. This is done by computing different combination of softmax around a particular input value and producing a value matrix output having the attention scores.

Figure 9:
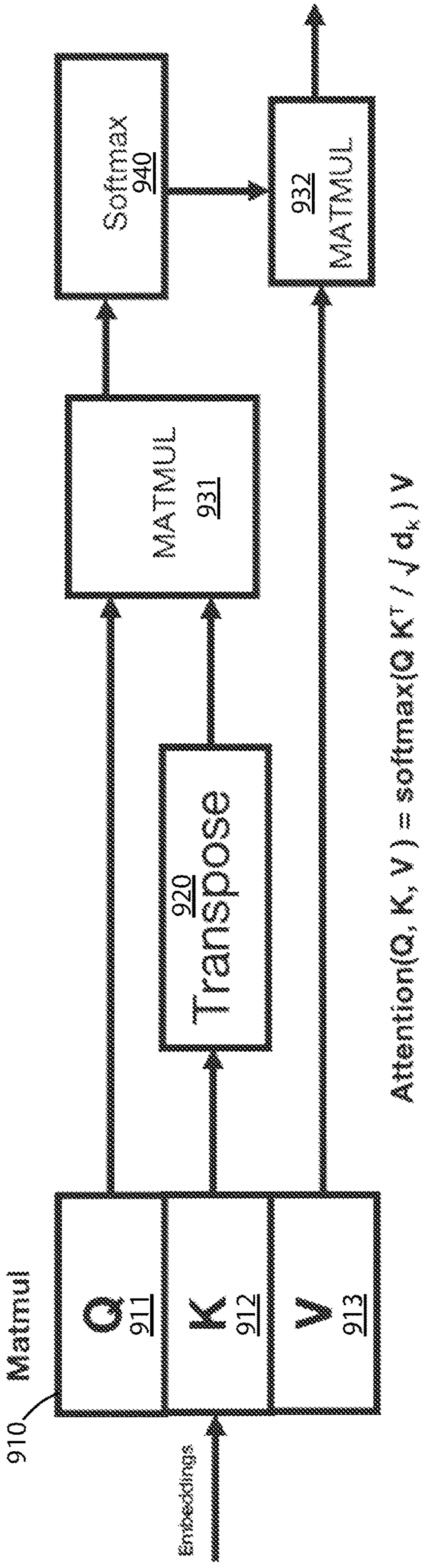
FIG. 9 is a simplified block diagram illustrating an attention head layer of an example transformer.

Further details of the attention head 810 are provided in FIG. 9. As shown, the attention head 900 computes a score according to an attention head function: Attention(Q, K, V)=softmax($QK^T/\sqrt{d_k}$)V. This function takes queries (Q), keys (K) of dimension $d_k$, and values (V) of dimension $d_k$ and computes the dot products of the query with all of the keys, divides the result by a scaling factor $\sqrt{d_k}$ and applies a softmax function to obtain the weights (i.e., probability distribution) on the values, as shown previously in FIG. 7.

The function is implemented by several matrix multipliers and function blocks. An input matrix multiplier 910 obtains the Q, K, and V vectors from the embeddings. The transpose function block 920 computes $K^T$, and a first matrix multiplier 931 computes the scaled dot product $QK^T/\sqrt{d_k}$. The softmax block 940 performs the softmax function on the output from the first matrix multiplier 931, and a second matrix multiplier 932 computes the dot product of the softmax result and V.

For BERT Large, 16 such independent attention heads run in parallel on 16 AI slices. These independent results are concatenated and projected once again to determine the final values. The multi-head attention approach can be used by transformers for (1) "encoder-decoder attention" layers that allow every position in the decoder to attend over all positions of the input sequence, (2) self-attention layers that allows each position in the encoder to attend to all positions in the previous encoder layer, and (3) self-attention layers that allow each position in the decoder to attend to all positions in the decoder up to and including that position. Of course, there can be variations, modifications, and alternatives in other transformer.

Returning to FIG. 8, the attention score output then goes to a first FC matrix layer 821, which is configured to process the outputs of all of the attention heads. The first FC matrix output goes to a first local response normalization (LRN) block 841 through a short-cut connection 830 that also receives the embedding inputs. The first LRN block output goes to a second FC matrix 822 and a third FC matrix 823 with a Gaussian Error Linear Unit (GELU) activation block 850 configured in between. The third FC matrix output goes to a second LRN block 842 through a second short-cut connection 832, which also receives the output of the first LRN block 841.

Using a transformer like BERT Large, NLP requires very high compute (e.g., five orders of magnitude higher than CV). For example, BERT Large requires 5.6 giga-multiply-accumulate operations per second ("GMACs") per transformer layer. Thus, the NLP inference challenge is to deliver this performance at the lowest energy consumption.

Although the present invention is discussed in the context of a BERT Large transformer for NLP applications, those of ordinary skill in the art will recognize variations, modifications, and alternatives. The particular embodiments shown can also be adapted to other transformer-based models and other AI/machine learning applications.

Many things impact the performance of such transformer architectures. The softmax function tends to be the critical path of the transformer layers (and has been difficult to accelerate in hardware). Requirements for overlapping the compute, SIMD operations and NoC transfers also impacts performance. Further, efficiency of NoC, SIMD, and memory bandwidth utilization is important as well.

Different techniques can be applied in conjunction with the AI accelerator apparatus and chiplet device examples to improve performance, such as quantization, sparsity, knowledge distillation, efficient tokenization, and software optimizations. Supporting variable sequence length (i.e., not requiring padding to the highest sequence lengths) can also reduce memory requirements. Other techniques can include optimizations of how to split self-attention among slices and chips, moving layers and tensors between the slices and chips, and data movement between layers and FC matrices.

According to an example, the present invention provides for an AI accelerator apparatus (such as shown in FIGS. 1A and 1B) coupled to an aggregate of transformer devices (e.g., BERT, BERT Large, GPT-2, GPT-3, or the like). In a specific example, this aggregate of transformer devices can include a plurality of transformers configured in a stack ranging from three to N layers, where N is an integer up to 128.

In an example, each of the transformers is configured within one or more DIMCs such that each of the transformers comprises a plurality of matrix multipliers including QKV matrices configured for an attention layer of a transformer followed by three fully-connected matrices (FC). In this configuration, the DIMC is configured to accelerate the transformer and further comprises a dot product of $QK^T$ followed by a softmax ($QK^T$/square root ($d_k$))V. In an example, the AI accelerator apparatus is also includes a SIMD device (as shown in FIGS. 3A and 3B) configured to accelerate a computing process of the softmax function.

According to an example, the present invention provides for methods of compiling the data representations related to transformer-based models mapping them to an AI accelerator apparatus in a spatial array. These methods can use the previously discussed numerical formats as well as sparsity patterns. Using a compile algorithm, the data can be configured to a dependency graph, which the global CPU can use to map the data to the tiles and slices of the chiplets. Example mapping methods are shown in FIGS. 10-13B.

Figure 10:
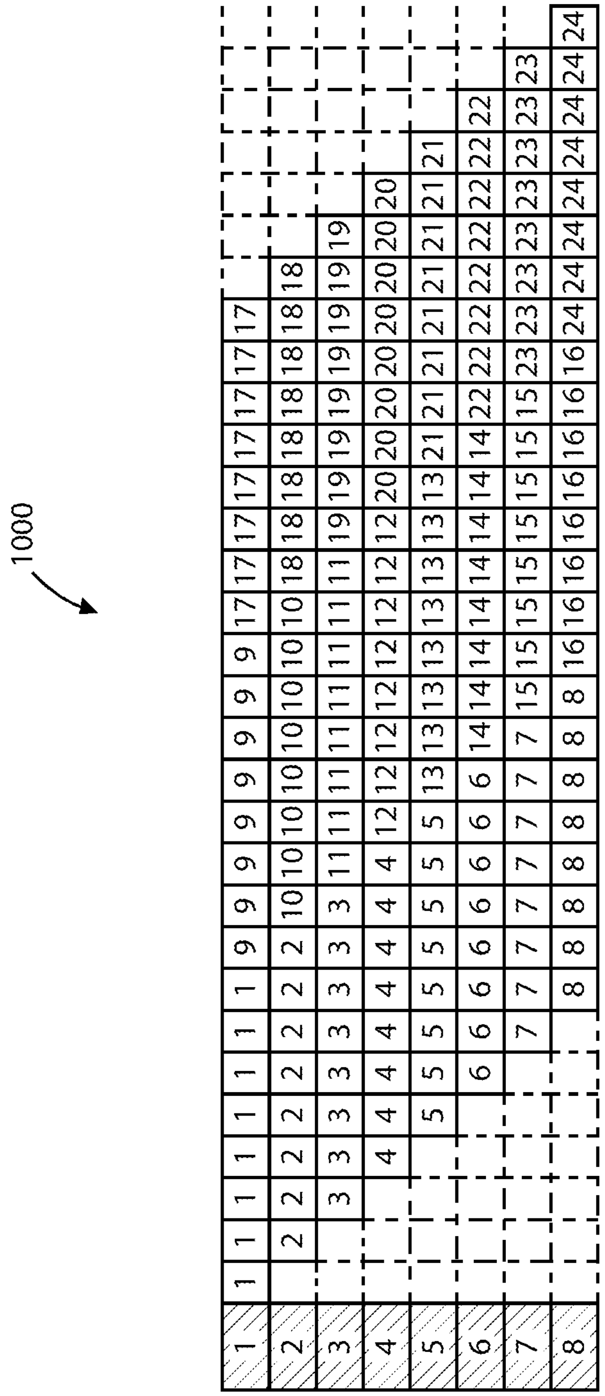
FIG. 10 is a simplified table representing an example mapping process between a 24-layer transformer and an example eight-chiplet AI accelerator apparatus according to an example of the present invention.

FIG. 10 is a simplified table representing an example mapping process between a 24-layer transformer and an example eight-chiplet AI accelerator apparatus. As shown, the chiplets are denoted by the row numbers on the left end and the model layers mapped over time are denoted by the table entry numbers. In this case, the 24 layers of the transformer (e.g., BERT Large) are mapped to the chiplets sequentially in a staggered manner (i.e., first layer mapped onto the first chiplet, the second layer mapped onto the second chiplet one cycle after the first, the third layer mapped onto the third chiplet two cycles after the first, etc.) After eight cycles, the mapping process loops back to the first chiplet to start mapping the next eight model layers.

Figure 11:
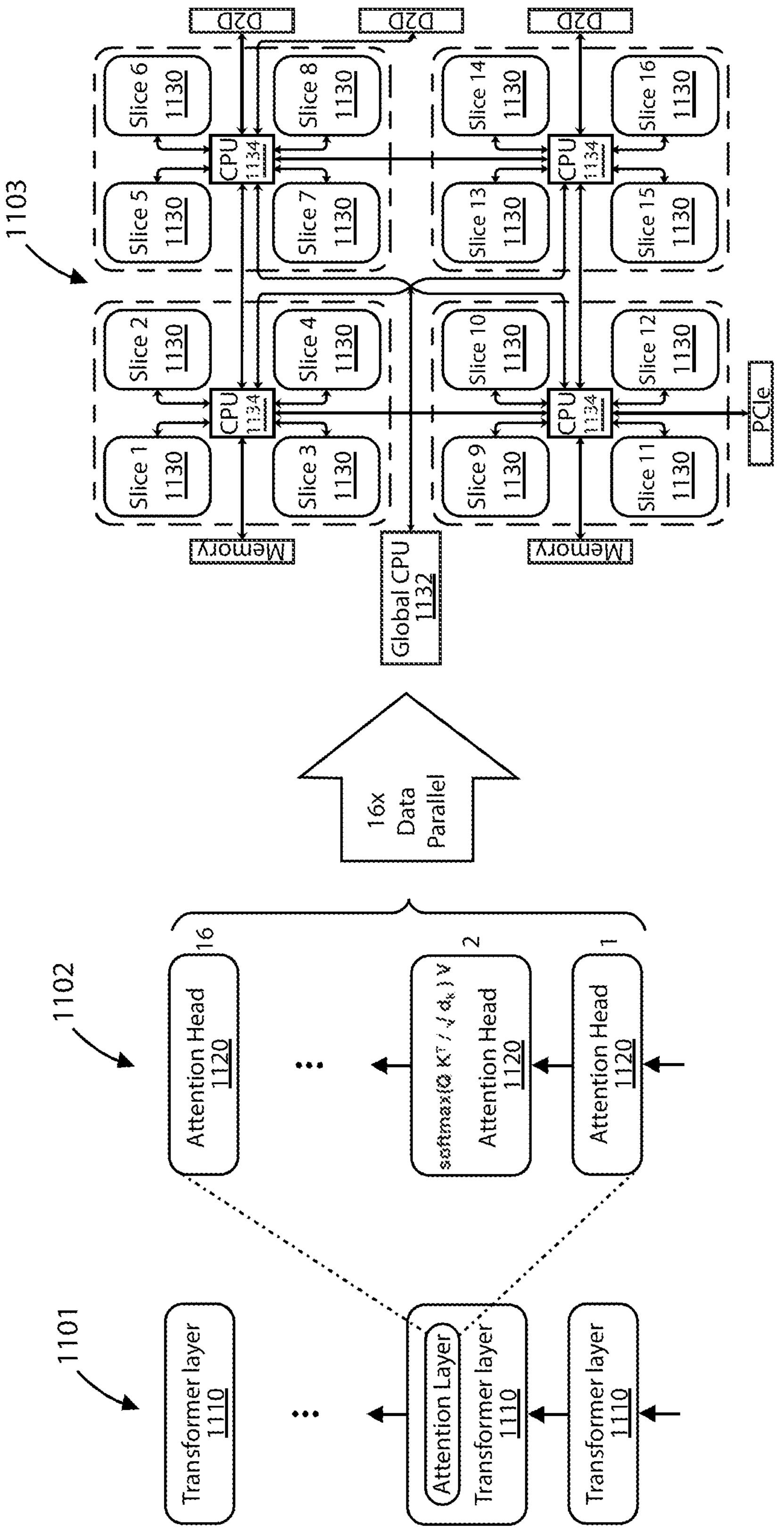
FIG. 11 is a simplified block flow diagram illustrating a mapping process between a transformer and an AI accelerator apparatus according to an example of the present invention.

FIG. 11 is a simplified block flow diagram illustrating a mapping process between a transformer and an example AI accelerator apparatus. As shown, a transformer 1101 includes a plurality of transformer layers 1110, each having an attention layer 1102. In this case, there are 16 attention heads 1110 (e.g., BERT Large) computing the attention function as discussed previously. These 16 attention heads are mapped to 16 slices 1130 of an AI accelerator apparatus 1103 (similar to apparatuses 201 and 202) via global CPU 1132 communicating to the slice CPUs 1134.

Figure 12:
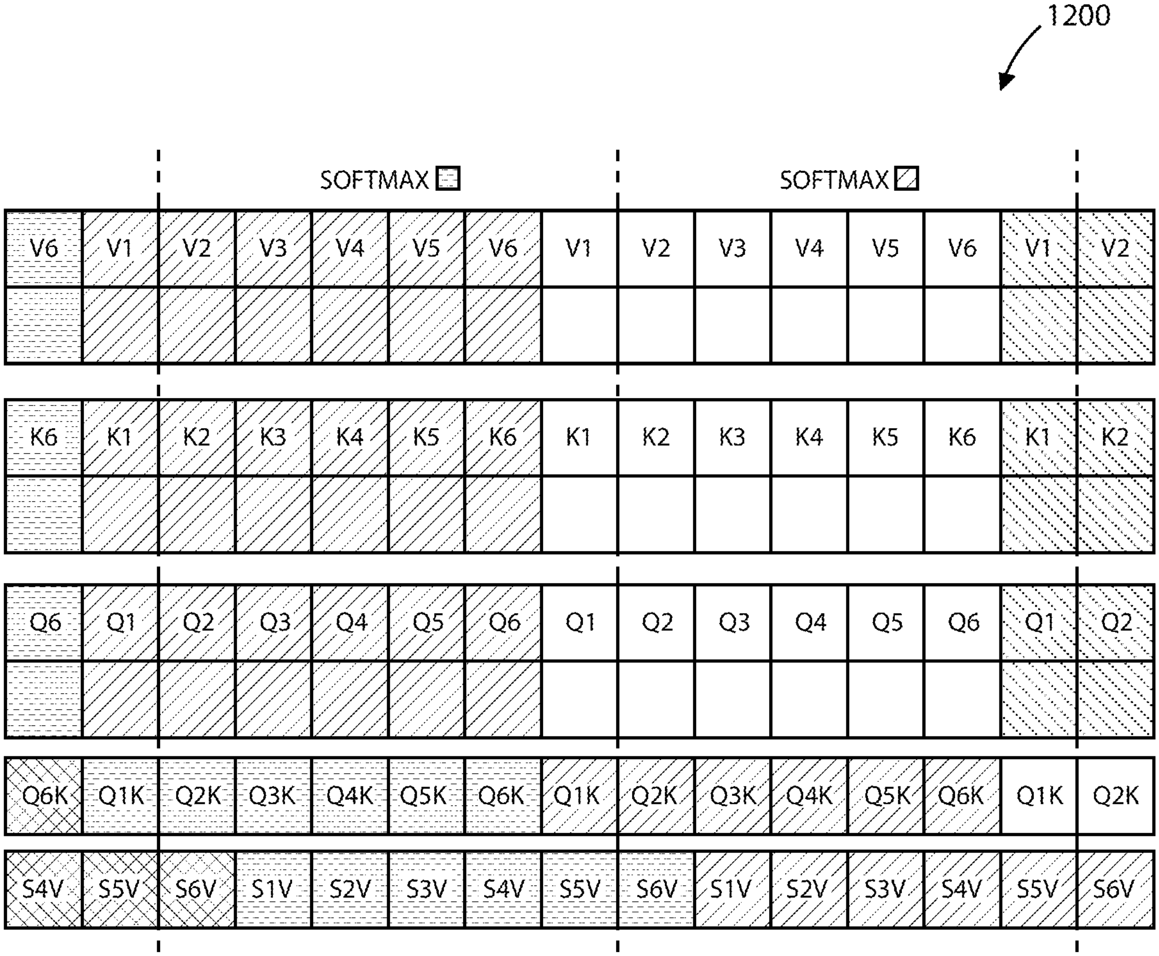
FIG. 12 is a simplified table representing a tiling attention process of a transformer to an AI accelerator apparatus according to an example of the present invention.

FIG. 12 is a simplified table representing an example tiling attention process between a transformer and an example AI accelerator apparatus. Table 1200 shows positions of Q, K, and V vectors and the timing of the softmax performed on these vectors. The different instances of the softmax are distinguished by fill pattern (e.g., diagonal line filled blocks representing Q, K, V vectors and diagonal line filled blocks representing Q-K and Softmax-V dot products).

In an example, the embedding E is a [64L, 1024] matrix (L=6 for sentence length of 384), and $E_i$ is a [64, 1024] submatrix of E, which is determined as $E_i = E_{(64i-63):(64i),\ 1:1024}$, where i=1 . . . L. Each of the K and Q matrices can be allocated to two slices (e.g., @[SL1:AC3,4]: $K_i \leftarrow E_i \times K_{1 \ldots 1024,\ 1 \ldots 64}$; and @[SL1:AC1,2]: $Q_i \leftarrow E_i \times Q_{1 \ldots 1024,\ 1 \ldots 64}$). An example data flows through IMC and SIMD modules are shown in the simplified tables of FIGS. 13A-13C.

FIG. 13A shows table 1301 representing mapping self-attention to an AI slice according to an example of the present invention. The left side shows the IMC cycles for matrix multiplications performed by IMC modules AC1-AC4, while the right side shows SIMD cycles for element-wise computations performed by SIMD modules SIMD1-SIMD4. In this example, the IMC modules determine the key vectors K1-K6 (a[64×512]; w[512×64]; o[64×64]), and query vectors Q1-Q6 (a[64×512]; w[512×64]; o[64×64]), followed by the transpose QKT1-QKT6 (a[64×64]; w[64×384]; o[64×384]). Then, the SIMD modules compute the softmax Smax1-Smax6 (a[64×384]). Meanwhile, the IMC modules determine the value vectors V1-V6 (a[64×512]; w[512×64]; o[64×64]), followed by the multiplication of the value vectors and the softmax results.

FIG. 13B shows table 1302 representing mapping dense embedding vectors and the second FC matrix to an AI slice (left: IMCs; right: SIMDs) according to an example of the present invention. In this example, the IMCs process the embedding vectors E1-E6 (a[64×512]; w[512×64]; o[64×64]), which corresponds to the path from the attention head 810 to the second FC matrix 822 in FIG. 8. Following the processing of each embedding vector E, the SIMDs process the GELU (a[64×64]), which corresponds to the path through the first LRN block 841 and the GELU block 850 in FIG. 8.

FIG. 13C shows table 1303 representing mapping the third FC matrix to an AI slice (left: IMCs; right: SIMDs) according to an example of the present invention. In this example, the IMCs process the results through the second FC matrix, which corresponds to the path through the third FC matrix 823 and the second LRN block 842 in FIG. 8. Those of ordinary skill in the art will recognize other variations, modifications, and alternatives to the mappings shown in FIGS. 10-13C.

Figure 14:
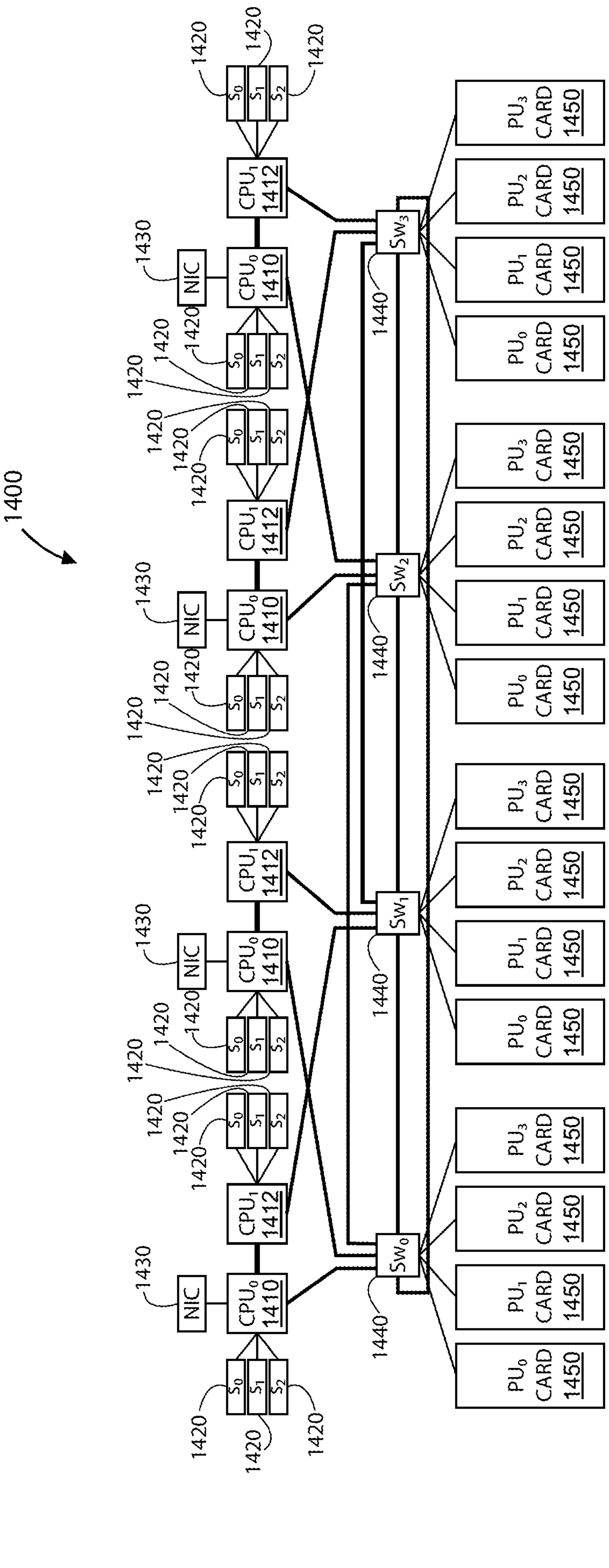
FIG. 14 is a simplified block diagram illustrating a server system according to an example of the present invention.

FIG. 14 is a simplified block diagram illustrating a server system according to an example of the present invention. As shown, the server system 1400 includes a plurality of processors devices 1410, and each processor device 1410 is coupled to one or more memory devices 1420 and a network interface controller (NIC) device 1430. In an example, the memory devices 1420 can include hard disk drives (HDDs) or solid state drives (SSDs), such as an E1.S SSD, or the like. Here, each processor device 1410 is coupled to three memory devices 1420 (denoted as $S_0$-$S_2$). Each processor device 1410 can also be coupled to one or more processor devices in a multiprocessor configuration. In a specific example, the processors in the multiprocessor configuration can be coupled using point-to-point processor interconnects, such as Ultra Path Interconnect (UPI) or the like. In FIG. 14, the system 1400 includes four multiprocessors, each having the first processor device 1410 coupled to a second processor device 1412.

The system 1400 also includes a plurality of switch devices 1440 coupled to the processor devices 1410, 1412. These switch devices 1440 can be configured for various form factors, such as peripheral component interconnect express (PCIe), or the like. Each switch device 1440 is coupled to each other switch device (e.g., using PCIe cables, or the like). In a specific example, certain connections between switches 1440 can be configured or pipeline traffic or host traffic. In FIG. 14, the system 1400 includes four switch devices 1440 (denoted as $Sw_0$-$Sw_3$) coupled to the processor devices 1410, 1412 such that the second processor device 1412 is coupled to a different switch device 1440 from the first processor device 1410.

Here, the first processor device 1410 of the first multiprocessor is coupled to the first switch device 1440, while the second processor device 1412 of the first multiprocessor is coupled to the second switch device 1440. Similarly, the first processor device 1410 of the second multiprocessor is coupled to the first switch device 1440, while the second processor device 1412 of the second multiprocessor is coupled to the second switch device 1440. The third and fourth multiprocessors have a similar configuration, except with the third and fourth switch devices 1440. Although system 1400 shows this pair coupling configuration between the first and second processor devices 1410, 1412 and the switch devices 1440, the coupling configurations can be scaled to larger subsets of switch devices 1440 with multiprocessors have additional processor devices.

Each switch device 1440 is also coupled to one or more processing unit (PU) devices 1450, which include can GPUs configurations, TPUs configurations, or the like. These PU devices 1450 can include the previously discussed AI accelerator apparatus configurations, which can include various form factors such as PCIe, or the like. In the PCIe card configuration, these PU devices 1450 can be configured similarly to the AI accelerator apparatuses 101 and 102 of FIGS. 1A and 1B. In FIG. 14, the system 1400 includes four PU devices (denoted as $PU_0$-$PU_3$). Those of ordinary skill in the art will recognize other variations, modifications, and alternatives to this server system configuration.

Figure 15:
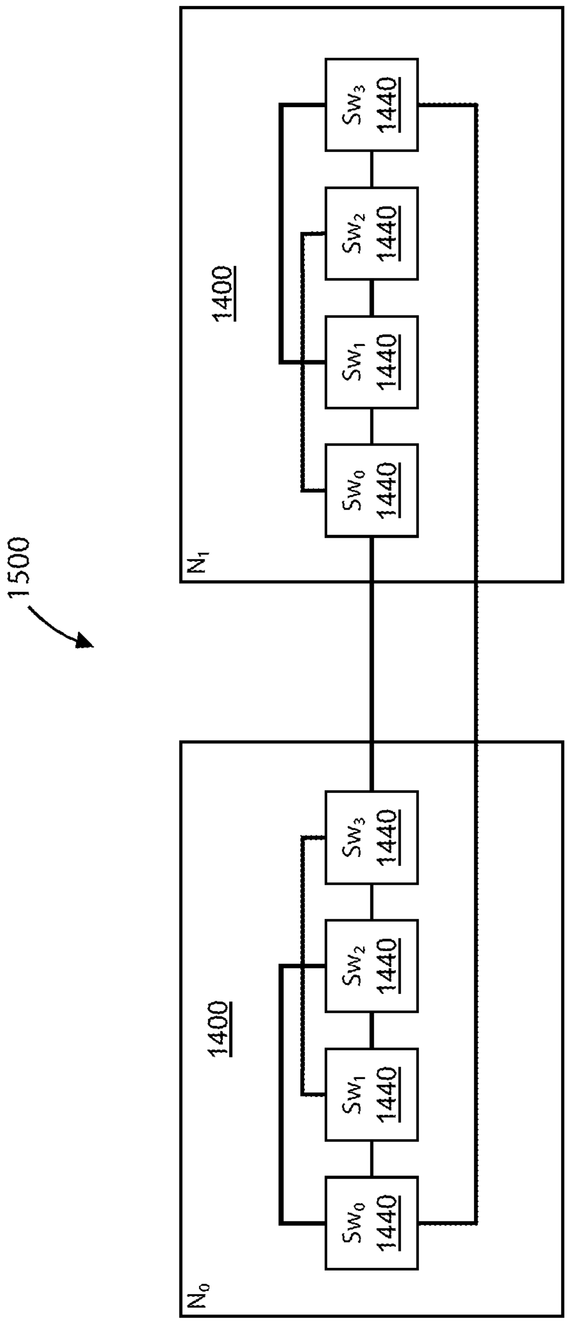
FIG. 15 is a simplified block diagram illustrating a multi-node server system according to an example of the present invention.

FIG. 15 is a simplified block diagram illustrating a multi-node server system according to an example of the present invention. As shown, the multi-node server system 1500 includes at least two server systems 1400 (see FIG. 14) configured as server nodes that are coupled together. Only the switch devices 1440 (denoted as $Sw_0$-$Sw_3$) are shown within each server system 1400 to highlight the example connections between the switch devices both within the node and between the two nodes. Here, the first switch device 1440 of the first node is coupled to the fourth switch device 1440 of the second node, and the fourth switch device 1440 of the first node is coupled to the first switch device 1440 of the second node. Depending on the application, the system 1500 can include one or more additional server nodes, and the connection configuration between switches in the nodes can vary. Alternatively, the nodes can be connected using the NICs within each node system 1400, such as a pipelined Ethernet connection, or the like. Those of ordinary skill in the art will recognize other variations, modifications, and alternatives to this multi-node server system configuration.

Figure 16:
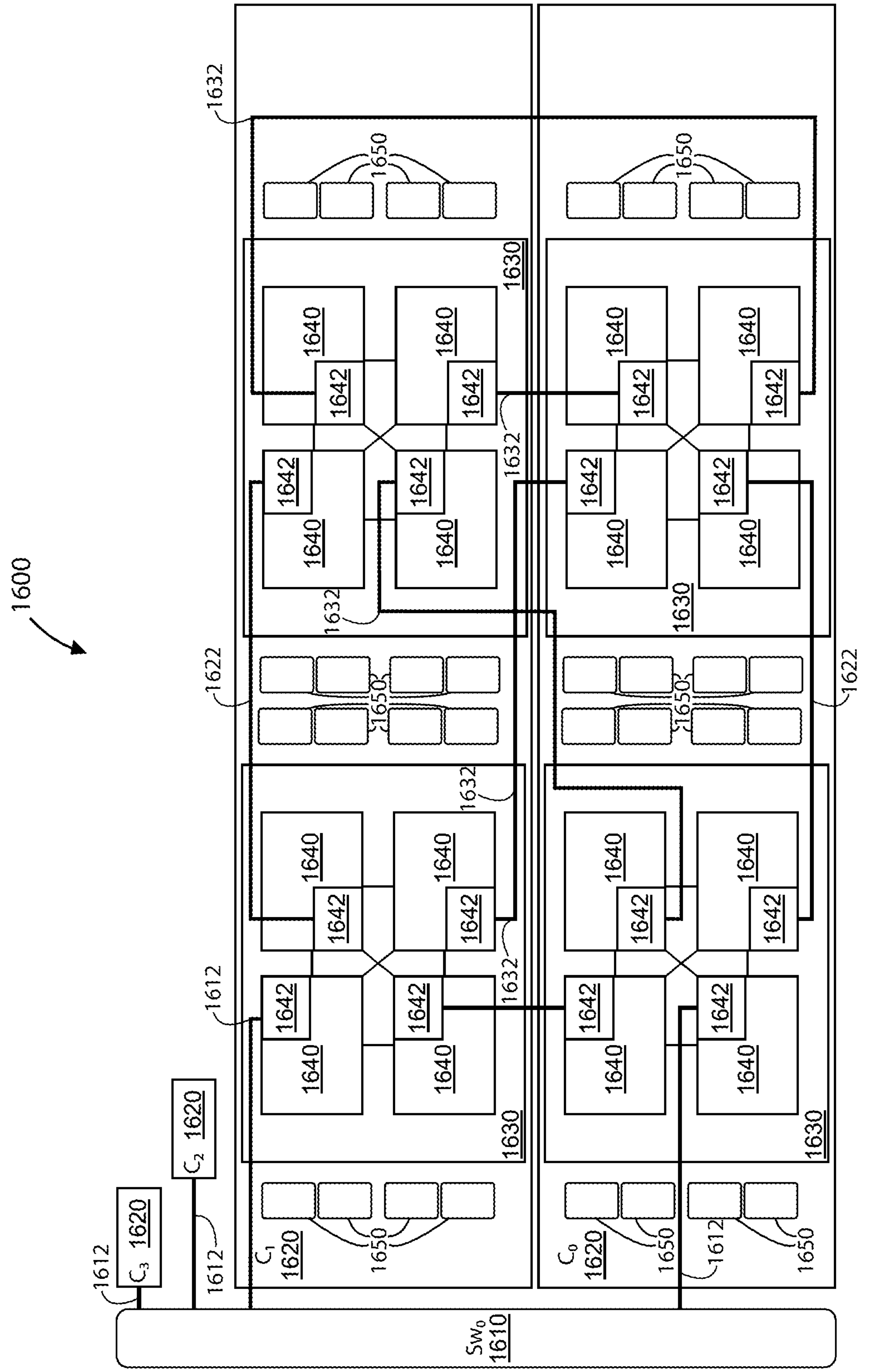
FIG. 16 is a simplified block diagram illustrating a portion of a server system according to an example of the present invention.

FIG. 16 is a simplified block diagram illustrating a portion of a server system according to an example of the present invention. As shown, the server system 1600 includes a switch device 1610 coupled to a plurality of PU card devices 1620. Similar to the server system 1400, this system 1600 includes four PU devices 1620 (denoted as $C_0$-$C_3$) in a card form factor (e.g., PCIe card, or the like). Here, the PU devices 1620 is configured similarly to the AI accelerator apparatus 102 of FIG. 1B with a eight chiplet devices 1640 formed overlying an interposer 1630 in two groups of four chiplets 1640 coupled together. Each of these chiplet devices 1640 also includes a connection interface 1642, such as a PCIe interface, or the like. Further, each group of chiplets 1640 is coupled to eight memory devices 1650 (e.g., DRAM, or the like). However, the specific number and configuration of these chiplet devices in the AI accelerator apparatus can vary and can include any of the configurations discussed previously.

The server system 1600 also includes details of various interconnections between chiplet devices 1640 within the same PU device 1620 and across different PU devices 1620. As shown in the expanded depiction of the first and second PU devices "$C_1$" and "$C_2$", the switch device 1610 is coupled to the connection interface 1642 of one of the chiplet devices 1640 of the first chiplet group in each PU device 1620 by connection pathways 1612. In a specific example, these connections pathways 1612 can include printed circuit board (PCB) pathways, cables, or the like. For both PU devices "$C_1$" and "$C_2$", a different chiplet device 1640 of the first chiplet group is also coupled to a different chiplet device 1640 in the second chiplet group via their connection interfaces 1642 by connection pathways 1622. In a specific example, these connection pathways 1622 can also include PCB pathways, cables, or the like.

Further, FIG. 16 shows that the remaining chiplet devices 1640 that were not coupled to the switch via connection pathways 1612 or coupled across chiplet groups via connection pathways 1622 are coupled to across the PU devices 1620 via their connection interfaces 1642 using bridge connection pathways 1632. More specifically, each of the two remaining chiplet devices 1640 in each group are coupled to chiplet devices 1640 of different chiplet groups in the other PU device 1620. The server system 1600 can include additional connections via connection pathways 1612 (switch-to-chiplet), 1622 (group-to-group), and 1632 (card-to-card) can be included to connect to other PU devices 1620 or in the case of a different configuration of chiplet devices 1640 in the AI accelerator apparatus. Those of ordinary skill in the art will recognize other variations, modifications, and alternatives.

Figure 17A:
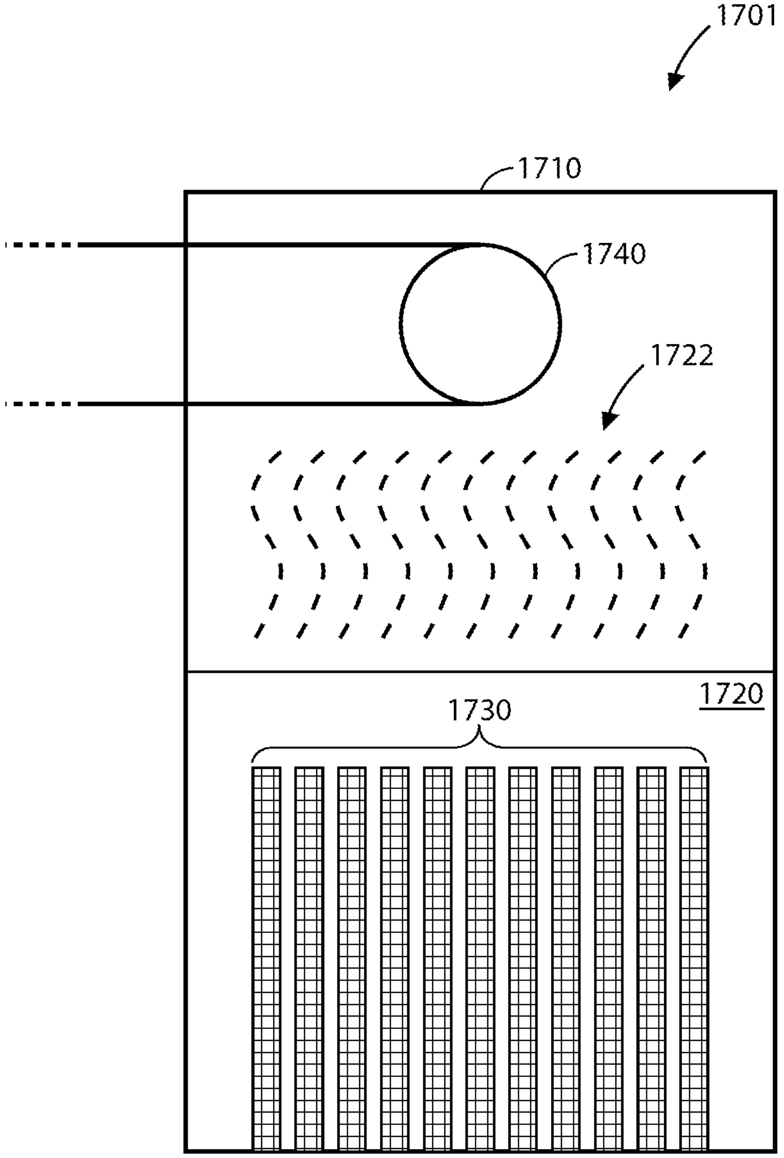
FIGS. 17A to 17C are simplified diagrams illustrating immersion cooling systems for AI accelerator apparatuses and server systems according to various embodiments of the present invention.
Figure 17B:
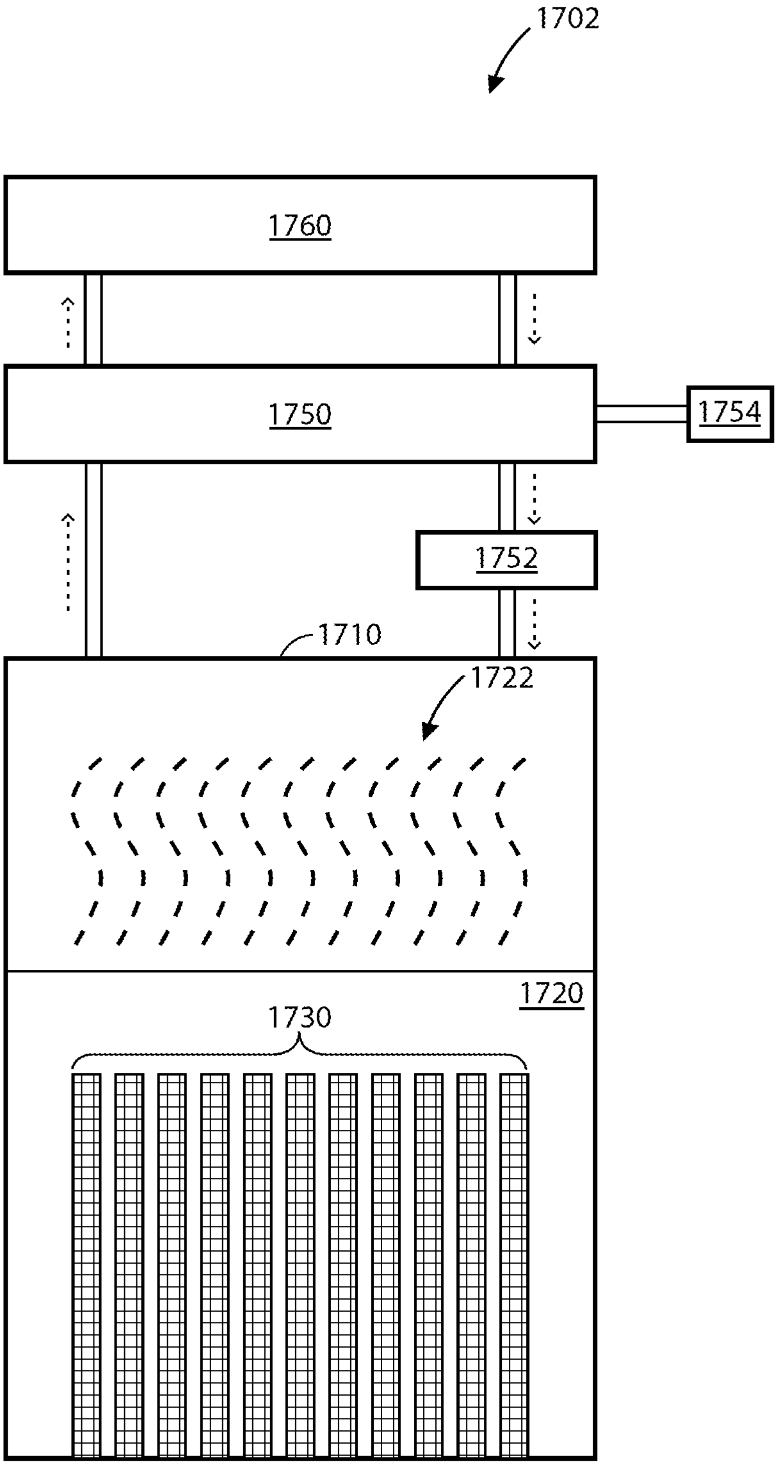
Figure 17C:
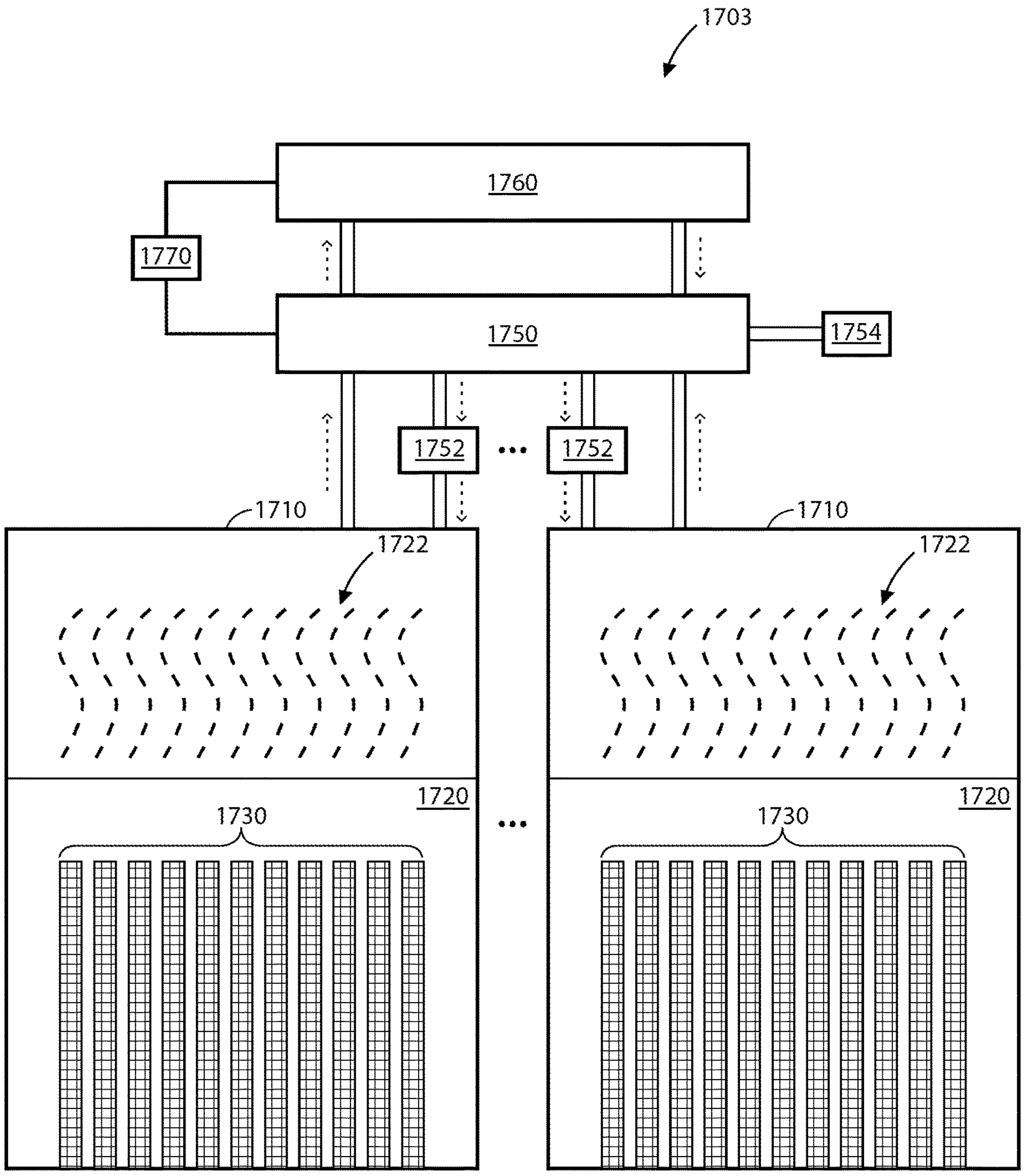

FIGS. 17A to 17C are simplified diagrams illustrating immersion cooling systems for AI accelerator apparatuses and server systems according to various embodiments of the present invention. These immersion cooling systems can be configured in various form factors and provided in various enclosures (e.g., shipping containers, utility enclosures, etc.) depending on the data center type (e.g., onsite data centers, edge data centers, mobile data centers, etc.). The same reference numerals across these figures refer to the same elements of the system discussed in previous figures. Those of ordinary skill in the art will recognize other variations, modifications, and alternatives to these configurations.

As shown in FIG. 17A, the system 1701 includes an immersion tank 1710 (or immersion chamber) that is partially filled with a heat transfer fluid 1720 in a liquid phase, which can be a dielectric fluid, or the like. This heat transfer fluid 1720 can include fluorocarbon fluids, hydrocarbon fluids, or the like. A plurality of electronic devices 1730 is immersed in the heat transfer fluid 1720. Each of these electronic devices 1730 can include a server system or an AI accelerator apparatus, such as those described previously. Here, the electronic devices 1730 are configured side-by-side (e.g., server rack configuration) along a bottom portion of the tank 1710, but there can be other configurations. In an example, the electronic devices 1730 or their sub-components can be treated or sealed to be liquid-resistant to allow for operation while submerged in the heat transfer fluid 1720.

The system 1701 also includes a condenser device 1740 configured in a portion of the tank 1710 overlying the heat transfer fluid 1720 and the electronic devices 1730. Here, the condenser device 1740 is shown as a coil condenser, but the condenser device can include lid condensers, separate condenser chambers, and other condenser types. When the electronic devices 1720 in operation, such as processing a transformer workload, they generate heat, which is transferred to the heat transfer fluid 1720. Once any portion of the heat transfer fluid 1720 starts to boil, it becomes a vapor 1722 that rises towards the top of the tank 1710. Once the vapor 1722 contacts the condenser device 174, the vapor 1722 condenses back into a liquid phase and returns to the heat transfer fluid 1720.

Through this process of evaporation, condensation, and precipitation (i.e., two-phase immersion cooling), the heat generated by the electronic devices 1720 can be regulated to prevent the electronic devices 1730 from overheating or to maintain optimal performance. As vapor 1722 is produced, the pressure of the tank 1710 increases. Here, the tank 1710 is hermetically sealed as a pressure vessel (e.g., closed-loop immersion cooling configuration) that can withstand high positive or negative pressures, but there can be other configurations.

Although system 1701 is a two-phase immersion cooling system, the plurality of electronic devices can be configured within single-phase immersion cooling systems as well. In such cases, the heat transfer fluid remains in liquid form and the system temperature is maintained primarily by the high thermal conductivity of the fluid. Such single-phase immersion cooling configurations can have simpler implementations compared to the two-phase immersion cooling configurations.

The immersion cooling system can also be combined with traditional air cooling systems in a hybrid immersion cooling configuration (e.g., rear door heat exchanger configuration, or the like). Although immersion cooling configurations provide highly efficient cooling for dense electronic device clusters, hybrid configurations can be simpler to implement.

In FIG. 17B, system 1702 is configured such that the tank 1710 is coupled to a condenser device 1750, which is coupled to a cooling device 1760. Between the tank 1710 and the condenser device 1750, there can be a first tank pathway (shown by dotted line arrow to the condenser device 1750) and a second tank pathway (shown by dotted line arrow to the tank 1710). Similarly, between the condenser device 1750 and the cooling device 1760, there can be a first condenser pathway (shown by the dotted line arrow to the cooling device 1760) and a second condenser pathway (shown by the dotted line arrow to the condenser device 1750). In an example, these pathways can be configured as tubes, couplings, openings, or the like.

As shown, the vapor 1722 rises through the first tank pathway to the condenser 1750, which can be configured to condense the vapor 1722 in to a liquid phase, which then returns to the tank 1710 via the second tank pathway. The condenser 1750 can be configured to condense the vapor 1722 using a coolant (e.g., water, anti-freeze, or the like) that circulates through the first condenser pathway to the cooling device 1760 and returns via the second condenser pathway. In an example, the condensed vapor 1722 returning to the tank 1710 can first move through a filter device 1752.

The filter device 1752 can be configured to remove any moisture remaining in the condensate and/or any particles from other parts of the system 1702 (e.g., leaching of primary oils out of elastomers). In an example, the filter device 1752 can include at least a filter cartridge, a filter inlet coupled to the filter cartridge and the converter 1750, and a filter outlet coupled to filter cartridge and the tank 1710). In a specific example, the filter cartridge can include a carbon filter cartridge, or other gas mask filter, or the like. The filter device 1752 can include a plurality of filter units that includes different filter cartridge types depending on the particular needs of the system 1702. Further, the filter device 1752 can be configured as an active filter device (e.g., using a pump device) or a passive filter device.

As discussed previously, when more vapor 1722 is produced, the pressure of the tank 1710 increases, which can be controlled via a pressure regulator device 1754. This pressure regulator device 1754 can be configured to respond when the pressure reaches a predetermined threshold to prevent the tank pressure from reaching an unsafe level. This regulator device 1754 can include a release valve that opens to reduce pressure, an expansion chamber that adjusts its size to changes in pressure, or the like. In a specific example, the tank pressure can be configured to be maintained at a desired pressure level, such as a near ambient pressure (i.e., about 1 atm), at all times.

In FIG. 17C, system 1703 is configured such that the condenser device 1750 is coupled to a plurality of tanks 1710, each with a plurality of electronic devices 1730 immersed in a heat transfer fluid 1720 (e.g., rack-level immersion cooling configuration). Each of the tanks 1710 includes at least the pair of pathways in the coupled configuration to the condenser 1750, as described for FIG. 17B.

And, a controller 1770 is coupled to the condenser device 1750 and the cooling device 1760.

The controller 1770 can be configured to manage the various aspects of operating the system 1703. For example, the controller 1770 can communicate with one or more sensors (e.g., configured within each of the tanks 1710 or in the pathways) to determine when the system conditions exceeds any predetermined threshold. Further, the controller 1770 can communicate with the release device 1754 to adjust in response to the system pressure (e.g., opening the release valve to reduce pressure). The controller 1770 can also be configured to monitor and adjust the operation of the cooling device 1760, such as increasing cooling performance according to a system threshold (e.g., temperature threshold, temperature rate change threshold, vapor concentration threshold, etc.) to maintain a desired operating system operating temperature or decreasing cooling performance to reduce power consumption.

Although the condenser device 1750, the expansion chamber 1754, and the cooling device 1760 are shown as single devices coupled to each tank 1710, each of these devices 1750, 1754, and 1760 can include individual units coupled to and configured specifically for each tank 1710. In such cases, the controller 1770 can monitor system operations for each tank 1710 separately and adjust specific operating parameters accordingly. And, although the filter devices 1752 are shown to be configured in separate pathways to each tank 1710, the system 1703 can alternatively have a main filter device that includes pathways coupled to each tank 1710.

Figure 18:
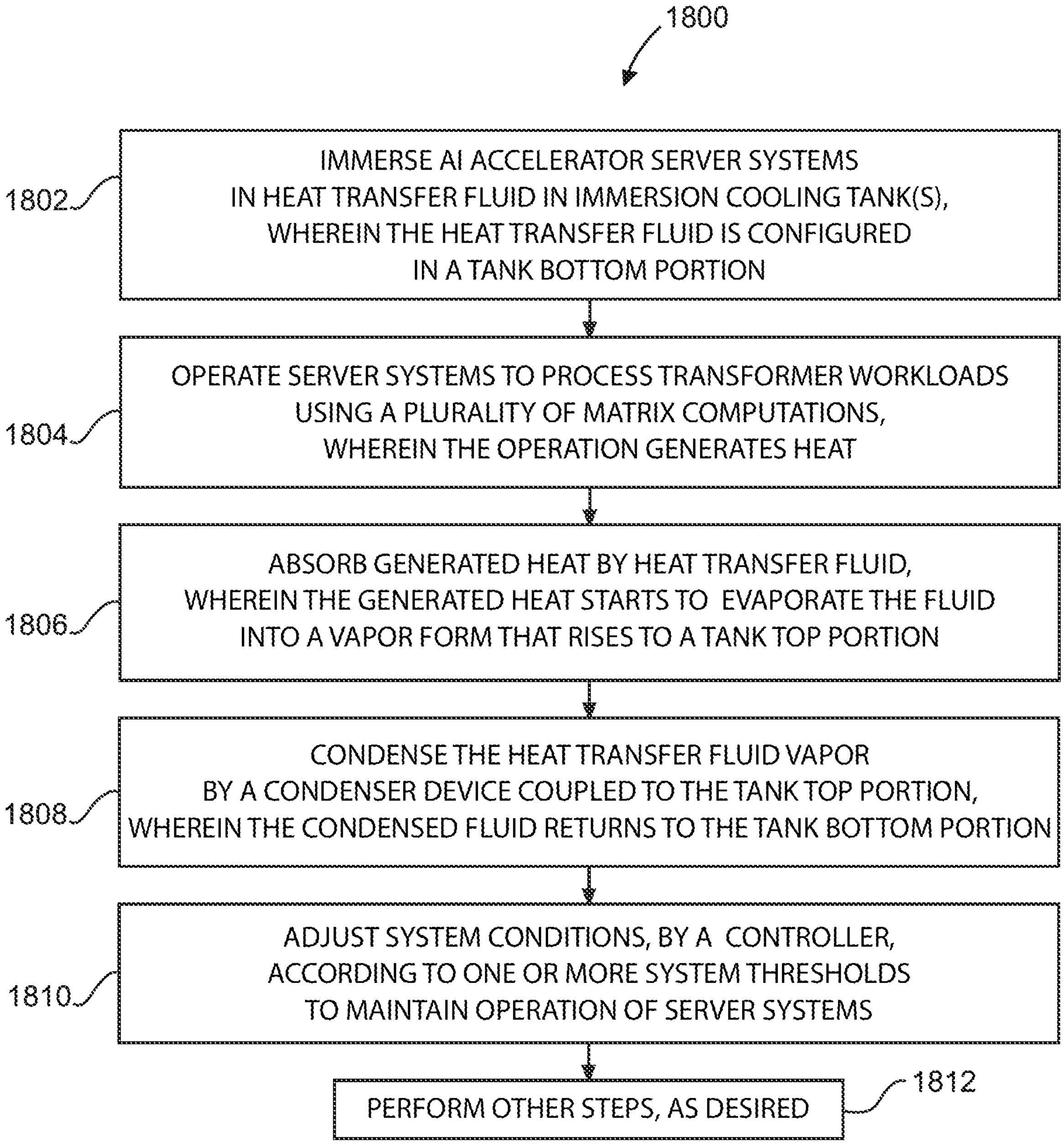
FIG. 18 is a simplified flow diagram illustrating a method of operating an immersion cooling system for AI accelerator servers according to an example of the present invention.

FIG. 18 is a simplified flow diagram illustrating a method 1800 of operating an immersion cooling system for AI accelerator servers according to an example of the present invention. This method 1800 can be briefly summarized as follows:

1802. Immerse a plurality of AI accelerator server systems in a heat transfer fluid in a liquid form provided in one or more immersion cooling tanks, the systems in the heat transfer fluid being configured within a bottom portion of the tanks;

1804. Operating the server systems to process transformer workloads using a plurality of matrix computations, wherein the operation causes the systems to generate heat;

1806. Absorbing the generated heat by the heat transfer fluid, wherein the generated heat starts to evaporate the fluid into a vapor form that rises to a top portion of the tanks;

1808. Condensing the heat transfer fluid vapor back in liquid form by a condenser device coupled to the top portion of each of the tanks, wherein the condensed heat transfer fluid returns to the bottom portion of the tanks;

1810. Adjusting system conditions by a controller coupled to the condenser device, according to one or more system thresholds to maintain the operation of the AI accelerator server systems; and

1812. Perform other steps as desired.

The above sequence of steps is used to operate an immersion cooling system for AI accelerator server systems according to one or more embodiments of the present invention. Depending on the embodiment, one or more of these steps can be combined, or removed, or other steps may be added without departing from the scope of the claims herein. One of ordinary skill in the art will recognize other variations, modifications, and alternatives. Further details of this method are provided below.

In step 1802, the method includes immersing a plurality of AI accelerator server systems in a heat transfer fluid in liquid form in one or more immersion cooling tanks. The immersion cooling tanks can be configured similarly to those shown in FIGS. 17A to 17C, including that the heat transfer fluid is configured within a bottom portion of the tanks.

In step 1804, the method includes operating the AI accelerator server systems to process transformer workloads using a plurality of matrix computations. This operation can include any of the AI accelerator apparatus and chiplet device operations discussed previously, such as the matrix computations used to determine the self-attention functions performed by digital in-memory compute (DIMC) devices and other related components. These systems generate heat while processing these workloads, which can negatively impact performance.

In step 1806, the method includes absorbing the generated heat by the heat transfer fluid in which the systems are immersed. As the heat is removed from the systems, the heat transfer fluid will start to evaporate as it reaches its boiling point, which creates heat transfer fluid vapor that rises to a top portion of the tanks.

In step 1808, the method includes condensing the heat transfer fluid vapor back in liquid form by a condenser device coupled to the top portion of each of the thanks. As discussed previously, the condenser device can be a central condenser device coupled to each of the tanks, or a condenser unit can be coupled to each of the tanks. And, there can also be a cooling device coupled to the condenser device that is configured with the condenser device to condense the vapor back to liquid form. Further, a filter device can be configured between the condenser device and the tanks to filter out moisture, contaminants, etc.

In step 1810, the method includes adjusting system conditions according to one or more system thresholds using a controller to maintain the operation of the server systems. As discussed previously, the controller can be configured to control a pressure regulator device coupled to the condenser device in response to changes in system pressure, such as maintaining an atmospheric pressure by opening a release valve when the pressure is increasing due to vapor build up. The controller can also be configured to communicate with a pressure sensor configured within the thanks or the pathways between the tanks and the condenser to determine whether to adjust system conditions using the pressure regulator device, the cooling device, or other system components.

As discussed previously, the method includes steps for processing a transformer workload using an immersion cooling system configured for AI accelerator server systems. Using such immersion cooling system configurations, the immersed server systems can exhibit improved computational performance, among other benefits. Following these steps, other steps can be performed as desired, as represented by step 1812.

While the above is a full description of the specific embodiments, various modifications, alternative constructions and equivalents may be used. As an example, the AI accelerator apparatus and chiplet devices can include any combination of elements described above, as well as outside of the present specification. Therefore, the above description and illustrations should not be taken as limiting the scope of the present invention which is defined by the appended claims.

What is claimed is:

1. An immersion cooling server system configured for processing transformer workloads using Artificial intelligence (AI) accelerator apparatuses with in-memory compute, the system comprising:

one or more immersion tanks, each having a heat transfer fluid in liquid form spatially configured within a bottom tank portion of the immersion tank, and each having a condenser device coupled to a top tank portion of the immersion tank, wherein the condenser device being configured to condense any heat transfer fluid vapor that rises to the top tank portion resulting in a condensed heat transfer fluid in liquid form; and wherein the condenser is configured to return the condensed heat transfer fluid back to the bottom tank portion;

a plurality of server systems immersed in the heat transfer fluid of each of the one or more immersion tanks, wherein the heat transfer fluid absorbs any heat generated by the plurality of server systems, and wherein at least a portion of the heat transfer fluid becomes heat transfer fluid vapor at a heat transfer fluid boiling point;

wherein each of the server systems comprises a plurality of first server central processing units (CPUs) and a plurality of second server CPUs, wherein each of the first server CPUs is coupled to one of the second server CPUs, wherein each of the first server CPUs and the second server CPUs is coupled to a plurality of memory devices, and wherein each of the first server CPUs is coupled a network interface controller (NIC) device;

a plurality of switch devices coupled to each other and to the plurality of first server CPUs and the plurality of second server CPUs, wherein each of the switch devices is coupled to a plurality of AI accelerator apparatuses, each of the AI accelerator apparatuses comprising:

one or N chiplets, where N is an integer greater than 1, each of the chiplets comprising a plurality of tiles, and each of the tiles comprising:

a plurality of slices, a CPU coupled to the plurality of slices, and a hardware dispatch device coupled to the CPU;

a first clock configured to output a clock signal of 0.5 GHz to 4 GHz;

a plurality of die-to-die (D2D) interconnects coupled to the each of CPUs in each of the tiles;

a peripheral component interconnect express (PCIe) bus coupled to the CPUs in each of the tiles, wherein each switch device is coupled to one of the plurality of chiplets of each AI accelerator apparatus via the PCIe bus, and one or more of the chiplets of each AI accelerator apparatus are coupled to one other of the chiplets of the AI accelerator apparatus via a bridge connection pathway;

a dynamic random access memory (DRAM) interface coupled to the CPUs in each of the tiles;

a global reduced instruction set computer (RISC) interface coupled to each of the CPUs in each of the tiles;

wherein each of the slices includes a digital in memory compute (DIMC) device coupled to a second clock and configured to allow for a throughput of one or more matrix computations provided in the DIMC device such that the throughput is characterized by 512 multiply accumulates per a clock cycle;

wherein the DIMC device is coupled to the second clock configured at an output rate of one half of the rate of the first clock; and a substrate member configured to provide mechanical support and having a surface region and an interposer, the surface region being coupled to support the one or N chiplets, and the one or N chiplets being coupled to each other using the interposer.

2. The system of claim 1 wherein each of the AI accelerator apparatuses comprises one or more double data rate (DDR) DRAM devices, the one or more DDR DRAM devices being coupled to one or more chiplets using the DRAM interface.

3. The system of claim 1 wherein each of the AI accelerator apparatuses comprises a main bus device, the main bus device being coupled to each PCIe bus in each chiplet using a master chiplet device, the master chiplet device being coupled to each of the other chiplet devices using at least the plurality of D2D interconnects.

4. The system of claim 3 wherein each of the AI accelerator apparatuses is configured and operable to the plurality of switch devices using the main bus device.

5. The system of claim 4 wherein the server apparatus is one of a plurality of server apparatuses configured for a server farm within a data center.

6. The system of claim 5 wherein each of the AI accelerator apparatuses is coupled to a power source.

7. The system of claim 1 wherein each of the AI accelerator apparatuses comprises an aggregate of transformer devices, the transformer devices comprising a plurality of transformers each of which is stacked in a layer by layer ranging from three (3) to M, where M is an integer up to 128.

8. The system of claim 7 wherein each of the plurality of transformers is configured within one or more DIMC devices such that each of the transformers comprises a plurality of matrix multipliers including a query key value (QKV) matrices configured for an attention layer of a transformer followed by three fully connected (FC) matrices.

9. The system of claim 8 wherein the DIMC device is configured to accelerate the transformer and further comprises a dot product of $QK^T$ followed by a softmax ($QK^T$/square root ($d_k$))V.

10. The system of claim 9 wherein each of the slices includes a single input multiple data (SIMD) device configured to accelerate a computing process of the softmax.

11. The system of claim 1 wherein each of the chiplets comprises four tiles arranged symmetrical to each other, each of the tiles comprises four slices.

12. The system of claim 1 wherein the DIMC device is configured to support one or more block floating point data types using a shared exponent.

13. The system of claim 12 wherein the DIMC device is configured to support a block structured sparsity.

14. The system of claim 1 wherein each of the AI accelerator apparatuses comprises a network on chip (NoC) device configured for a multicast process and coupled to each of the plurality of slices.

15. The system of claim 1 wherein the one or N chiplets are configured to process a workload of a transformer;

wherein the transformer includes a plurality of transformer layers, each of the transformer layers having an attention layer associated with a portion of the workload; and wherein each attention layer is mapped on to one of the plurality of slices using the global RISC interface to communicate with the CPU associated with the tile of the slice to process the portion of the workload associated with the attention layer.

16. The system of claim 1 wherein the heat transfer fluid includes a fluorocarbon fluid or a hydrocarbon fluid, and wherein the condenser device includes a coil condenser device, a lid condenser device, or a condenser chamber device.

17. The system of claim 1 further comprising a filter device coupled between the condenser device and immersion tank, wherein the filter device is configured to filter the condensed heat transfer fluid before returning to the heat transfer fluid in the bottom tank portion.

18. The system of claim 1 further comprising a cooling device coupled to the condenser device, the cooling device being configured with the condenser device to condense any heat transfer fluid vapor that rises to the top tank portion.

19. The system of claim 1 further comprising a pressure regulator device coupled to the condenser device, wherein the pressure regulator device is configured to maintain a desired pressure level within the immersion tank, and wherein the pressure regulator device includes a release valve or an expansion chamber.

20. The system of claim 1 further comprising a cooling device coupled to the condenser device, the cooling device being configured with the condenser device to condense any heat transfer fluid vapor that rises to the top tank portion;

a pressure regulator device coupled to the condenser device; and a controller coupled to the condenser device, the pressure regulator device, and the cooling device; wherein the controller is configured to operate the pressure regulator device when a system pressure exceeds a predetermined pressure threshold, and wherein the controller is configured to adjust a cooling performance of the cooling device in response to changes in a system temperature.

21. A multi-node immersion cooling server system configured for processing transformer workloads using Artificial intelligence (AI) accelerator apparatuses with in-memory compute, the system comprising:

one or more immersion tanks, each having a heat transfer fluid in liquid form spatially configured within a bottom tank portion of the immersion tank, and each having a condenser device coupled to a top tank portion of the immersion tank, wherein the condenser device being configured to condense any heat transfer fluid vapor that rises to the top tank portion resulting in a condensed heat transfer fluid in liquid form; and wherein the condenser is configured to return the condensed heat transfer fluid back to the bottom tank portion;

a plurality of server systems immersed in the heat transfer fluid of each of the one or more immersion tanks, wherein the heat transfer fluid absorbs any heat generated by the plurality of server systems, and wherein at least a portion of the heat transfer fluid becomes heat transfer fluid vapor at a heat transfer fluid boiling point;

wherein each of the server systems comprises a plurality of server nodes, wherein each of the server nodes comprises a plurality of first server central processing units (CPUs) and a plurality of second server CPUs, wherein each of the first server CPUs is coupled to one of the second server CPUs, wherein each of the first server CPUs and the second server CPUs is coupled to a plurality of memory devices, and wherein each of the first server CPUs is coupled a network interface controller (NIC) device;

a plurality of switch devices coupled to each other and to the plurality of first server CPUs and the plurality of second server CPUs, wherein each plurality of switch devices of each server node is coupled to the plurality of switch devices of each other server node; and wherein each of the switch devices is coupled to a plurality of AI accelerator apparatuses, each of the AI accelerator apparatuses comprising:

one or N chiplets, where N is an integer greater than 1, each of the chiplets comprising a plurality of tiles, and each of the tiles comprising a plurality of slices, a CPU coupled to the plurality of slices, and a hardware dispatch device coupled to the CPU;

a first clock configured to output a clock signal of 0.5 GHz to 4 GHz;

a plurality of die-to-die (D2D) interconnects coupled to the each of CPUs in each of the tiles;

a peripheral component interconnect express (PCIe) bus coupled to the CPUs in each of the tiles, wherein each switch device is coupled to one of the plurality of chiplets of each AI accelerator apparatus via the PCIe bus, and one or more of the chiplets of each AI accelerator apparatus are coupled to one other of the chiplets of the AI accelerator apparatus via a bridge connection pathway;

a dynamic random access memory (DRAM) interface coupled to the CPUs in each of the tiles;

a global reduced instruction set computer (RISC) interface coupled to each of the CPUs in each of the tiles;

wherein each of the slices includes a digital in memory compute (DIMC) device coupled to a second clock and configured to allow for a throughput of one or more matrix computations provided in the DIMC device such that the throughput is characterized by 512 multiply accumulates per a clock cycle;

wherein the DIMC device is coupled to the second clock configured at an output rate of one half of the rate of the first clock; and a substrate member configured to provide mechanical support and having a surface region and an interposer, the surface region being coupled to support the one or N chiplets, and the one or N chiplets being coupled to each other using the interposer.

22. The system of claim 21 wherein each of the AI accelerator apparatuses comprises one or more double data rate (DDR) DRAM devices, the one or more DDR DRAM devices being coupled to one or more chiplets using the DRAM interface.

23. The system of claim 21 wherein each of the AI accelerator apparatuses comprises a main bus device, the main bus device being coupled to each PCIe bus in each chiplet using a master chiplet device, the master chiplet device being coupled to each of the other chiplet devices using at least the plurality of D2D interconnects.

24. The system of claim 23 wherein each of the AI accelerator apparatuses is configured and operable to the plurality of switch devices using the main bus device.

25. The system of claim 24 wherein the server apparatus is one of a plurality of server apparatuses configured for a server farm within a data center.

26. The system of claim 25 wherein each of the AI accelerator apparatuses is coupled to a power source.

27. The system of claim 21 wherein each of the AI accelerator apparatuses comprises an aggregate of transformer devices, the transformer devices comprising a plurality of transformers each of which is stacked in a layer by layer ranging from three (3) to M, where M is an integer up to 128.

28. The system of claim 27 wherein each of the plurality of transformers is configured within one or more DIMC devices such that each of the transformers comprises a plurality of matrix multipliers including a query key value (QKV) matrices configured for an attention layer of a transformer followed by three fully connected (FC) matrices.

29. The system of claim 28 wherein the DIMC device is configured to accelerate the transformer and further comprises a dot product of $QK^T$ followed by a softmax ($QK^T$/square root ($d_k$))V.

30. The system of claim 29 wherein each of the slices includes a single input multiple data (SIMD) device configured to accelerate a computing process of the softmax.

31. The system of claim 21 wherein each of the chiplets comprises four tiles arranged symmetrical to each other, each of the tiles comprises four slices.

32. The system of claim 21 wherein the DIMC device is configured to support one or more block floating point data types using a shared exponent.

33. The system of claim 32 wherein the DIMC device is configured to support a block structured sparsity.

34. The system of claim 21 wherein each of the AI accelerator apparatuses comprises a network on chip (NoC) device configured for a multicast process and coupled to each of the plurality of slices.

35. The system of claim 21 wherein the one or N chiplets are configured to process a workload of a transformer;

wherein the transformer includes a plurality of transformer layers, each of the transformer layers having an attention layer associated with a portion of the workload; and wherein each attention layer is mapped on to one of the plurality of slices using the global RISC interface to communicate with the CPU associated with the tile of the slice to process the portion of the workload associated with the attention layer.

36. The system of claim 21 wherein the heat transfer fluid includes a fluorocarbon fluid or a hydrocarbon fluid, and wherein the condenser device includes a coil condenser device, a lid condenser device, or a condenser chamber device.

37. The system of claim 21 further comprising a filter device coupled between the condenser device and immersion tank, wherein the filter device is configured to filter the condensed heat transfer fluid before returning to the heat transfer fluid in the bottom tank portion.

38. The system of claim 21 further comprising a cooling device coupled to the condenser device, the cooling device being configured with the condenser device to condense any heat transfer fluid vapor that rises to the top tank portion.

39. The system of claim 21 further comprising a pressure regulator device coupled to the condenser device, wherein the pressure regulator device is configured to maintain a desired pressure level within the immersion tank, and wherein the pressure regulator device includes a release valve or an expansion chamber.

40. The system of claim 21 further comprising a cooling device coupled to the condenser device, the cooling device being configured with the condenser device to condense any heat transfer fluid vapor that rises to the top tank portion;

a pressure regulator device coupled to the condenser device; and a controller coupled to the condenser device, the pressure regulator device, and the cooling device; wherein the controller is configured to operate the pressure regulator device when a system pressure exceeds a predetermined pressure threshold, and wherein the controller is configured to adjust a cooling performance of the cooling device in response to changes in a system temperature.

41. An immersion cooling server system configured for processing transformer workloads, the system comprising:

one or more immersion tanks, each having a heat transfer fluid in liquid form spatially configured within a bottom tank portion of the immersion tank, and each having a condenser device coupled to a top tank portion of the immersion tank, wherein the condenser device being configured to condense any heat transfer fluid vapor that rises to the top tank portion resulting in a condensed heat transfer fluid in liquid form; and wherein the condenser is configured to return the condensed heat transfer fluid back to the bottom tank portion;

a plurality of server systems immersed in the heat transfer fluid of each of the one or more immersion tanks, wherein the heat transfer fluid absorbs any heat generated by the plurality of server systems, and wherein at least a portion of the heat transfer fluid becomes heat transfer fluid vapor at a heat transfer fluid boiling point;

wherein each of the server systems comprises a plurality of server nodes, wherein each of the server nodes comprises:

a plurality of multiprocessors, each multiprocessor having at least a first central processing unit (CPU) and a second CPU, wherein the first CPU is coupled the second CPU via a point-to-point interconnect, wherein each of the first CPU and the second CPU is coupled to a plurality of memory devices, and wherein the first CPU is coupled a network interface controller (NIC) device;

a plurality of connected switch devices coupled to the plurality of multiprocessors such that each of the CPUs of each multiprocessor is coupled to a different switch device, wherein each of the switch devices is coupled to a plurality of Artificial intelligence (AI) accelerator apparatuses;

wherein each of the AI accelerator apparatuses comprises a plurality of chiplet devices, each of the chiplet devices comprising a plurality of tile devices, each of the tile devices comprising a plurality of slice devices, and each of the slice devices comprises a digital in-memory-compute (DIMC) device, a chiplet CPU coupled to the plurality of slice devices, and a hardware dispatch device coupled to the chiplet CPU;

a plurality of die-to-die (D2D) interconnects coupled to the each of chiplet CPUs in each of the tiles;

a peripheral component interconnect express (PCIe) bus coupled to the chiplet CPUs in each of the tiles, wherein each switch device is coupled to one of the plurality of chiplet devices of each AI accelerator apparatus via the PCIe bus, and one or more of the chiplet devices of each AI accelerator apparatus are coupled to one other of the chiplet devices of the AI accelerator apparatus via a bridge connection pathway;

a dynamic random access memory (DRAM) interface coupled to the chiplet CPUs in each of the tiles, wherein the DRAM interface is coupled to a plurality of DRAM devices; and a substrate member configured to provide mechanical support and having a surface region and an interposer, the surface region being coupled to support the plurality of chiplet devices, and the plurality of chiplet devices being coupled to each other using the interposer.

42. The system of claim 41 wherein the heat transfer fluid includes a fluorocarbon fluid or a hydrocarbon fluid, and wherein the condenser device includes a coil condenser device, a lid condenser device, or a condenser chamber device.

43. The system of claim 41 further comprising a filter device coupled between the condenser device and immersion tank, wherein the filter device is configured to filter the condensed heat transfer fluid before returning to the heat transfer fluid in the bottom tank portion.

44. The system of claim 41 further comprising a cooling device coupled to the condenser device, the cooling device being configured with the condenser device to condense any heat transfer fluid vapor that rises to the top tank portion.

45. The system of claim 41 further comprising a pressure regulator device coupled to the condenser device, wherein the pressure regulator device is configured to maintain a desired pressure level within the immersion tank, and wherein the pressure regulator device includes a release valve or an expansion chamber.

46. The system of claim 41 further comprising a cooling device coupled to the condenser device, the cooling device being configured with the condenser device to condense any heat transfer fluid vapor that rises to the top tank portion;

a pressure regulator device coupled to the condenser device; and a controller coupled to the condenser device, the pressure regulator device, and the cooling device; wherein the controller is configured to operate the pressure regulator device when a system pressure exceeds a predetermined pressure threshold, and wherein the controller is configured to adjust a cooling performance of the cooling device in response to changes in a system temperature.

47. A method of operating an immersion cooling server system configured for processing transformer workloads using Artificial intelligence (AI) accelerator apparatuses with in-memory compute, the method comprising:

immersing a plurality of server systems in a heat transfer fluid in liquid form provided in one or more immersion tanks, wherein the heat transfer fluid is spatially configured within a bottom tank portion of the immersion tank;

operating the plurality of server systems to process one or more transformer workload using a plurality of matrix computations, wherein the operation causes the plurality of server systems to generate heat;

absorbing the generated heat by the heat transfer fluid, wherein the generated heat starts to evaporate the heat transfer fluid into a vapor form that rises to a top tank portion of the immersion tank; and condensing the heat transfer fluid in vapor form back in liquid form by a condenser device coupled to a top tank portion of the immersion tank, wherein the condensed heat transfer fluid returns to the bottom tank portion;

wherein each of the plurality of server systems includes a plurality of AI accelerator apparatuses, each of the AI accelerator apparatuses having a plurality of chiplet devices, each of the chiplet devices having a plurality of slice devices, and operating the plurality of server systems includes operating each of the plurality of slice devices to process the one or more transformer workloads;

wherein operating each of the plurality of slice devices comprises receiving, by an input buffer (TB) device coupled a crossbar device, a plurality of matrix inputs in a first format;

wherein a compute device is coupled to the IB device and the crossbar device, an output buffer (OB) device is coupled to the compute device and the crossbar device, a Single Instruction, Multiple Data (SIMD) device is coupled to the OB device, a crossbar converter device is coupled to the OB device and the crossbar device, and a memory device is coupled to the crossbar device;

determining a first projection token, a second projection token, and a third projection token in the first format for each of the plurality of matrix inputs using the compute device;

determining, by the crossbar converter device, a plurality of converted second projection tokens in a second format using the plurality of second projection tokens;

determining, by the crossbar converter device, a plurality of converted third projection tokens in the second format using the plurality of third projection tokens;

determining, by the crossbar converter device, a plurality of converted first projection tokens in the second format using the plurality of first projection tokens;

determining, by the compute device and the SIMD device, a plurality of normalized score values using the plurality of converted third projection tokens and the plurality of converted second projection tokens;

determining, by the compute device, a plurality of weighted first projection tokens using the plurality of normalized score values and the plurality of converted first projection tokens; and determining, by the compute device, a weighted tokens sum using the plurality of weighted first projection tokens.

48. The method of claim 47 wherein the first format comprises a floating point (FP) format, and wherein the second format comprises a block floating point (BFP) format.

49. The method of claim 47 wherein determining the plurality of converted first projection tokens in the second format comprises determining, by the crossbar converter device, a first plurality of mantissa values and a first plurality of shared exponents using the plurality of first projection tokens;

wherein determining the plurality of converted second projection tokens comprises determining, by the crossbar converter device, a second plurality of mantissa values and a second plurality of shared exponents using the plurality of second projection tokens; and wherein determining the plurality of converted third projection tokens comprises determining, by the crossbar converter device, a third plurality of mantissa values and a third plurality of shared exponents using the plurality of third projection tokens.

50. The method of claim 47 wherein determining the plurality of normalized score values comprises determining, by the compute device, a plurality of score values using the plurality of converted second projection tokens and the plurality of converted third projection tokens; and applying, by the SIMD device, a softmax operation to the plurality of score values resulting in the plurality of normalized score values.

51. The method of claim 47 wherein the heat transfer fluid includes a fluorocarbon fluid or a hydrocarbon fluid, and wherein the condensing the heat transfer fluid in vapor form by the condenser device comprises condensing the heat transfer fluid by a coil condenser device, a lid condenser device, or a condenser chamber device.

52. The method of claim 47 further comprising filtering the condensed heat transfer fluid, by a filter device coupled between the condenser device and immersion tank, before the condensed heat transfer fluid returns to the bottom tank portion.

53. The method of claim 47 further comprising condensing, by a cooling device coupled to the condenser device, any heat transfer fluid vapor that rises to the top tank portion.

54. The method of claim 47 further comprising maintaining, by a pressure regulator device coupled to the condenser device, a desired pressure level within the immersion tank; wherein the pressure regulator device includes a release valve or an expansion chamber.

55. The method of claim 47 further comprising condensing, by a cooling device coupled to the condenser device, any heat transfer fluid vapor that rises to the top tank portion;

maintaining, by a pressure regulator device coupled to the condenser device, a desired pressure level within the immersion tank;

wherein a controller is coupled to the condenser device, the pressure regulator device, and the cooling device;

operating, by the controller, the pressure regulator device when a system pressure exceeds a predetermined pressure threshold; and adjusting, by the controller, a cooling performance of the cooling device in response to changes in a system temperature.

* * * * *